(12) United States Patent
Noh et al.

(10) Patent No.: US 10,020,234 B2
(45) Date of Patent: Jul. 10, 2018

(54) METHOD OF INSPECTING DEVICE USING FIRST MEASUREMENT AND SECOND MEASUREMENT LIGHTS

(71) Applicant: SAMSUNG ELECTRONICS CO., LTD., Suwon-si, Gyeonggi-do (KR)

(72) Inventors: Young-Jin Noh, Ansan-si (KR); Jung-Sub Lee, Hwaseong-si (KR); Sung-Mo Gu, Daegu (KR)

(73) Assignees: SAMSUNG ELECTRONICS CO., LTD., Suwon-si, Gyeonggi-Do (KR); SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 23 days.

(21) Appl. No.: 15/233,643

(22) Filed: Aug. 10, 2016

(65) Prior Publication Data

US 2017/0133280 A1    May 11, 2017

(30) Foreign Application Priority Data

Nov. 10, 2015   (KR) .................. 10-2015-0157543

(51) Int. Cl.
*H01L 21/66* (2006.01)
*H01L 27/12* (2006.01)

(52) U.S. Cl.
CPC .......... *H01L 22/12* (2013.01); *H01L 27/1259* (2013.01)

(58) Field of Classification Search
CPC . H01L 22/12; H01L 27/1259; G01N 21/9501; G01N 21/956; G01N 21/88; G01N 21/95

USPC ............................................... 356/237.3, 341
See application file for complete search history.

(56) References Cited

U.S. PATENT DOCUMENTS

| 7,268,865 B2 | 9/2007 | Chou et al. |
| 2004/0150408 A1* | 8/2004 | Chung ............. G05B 19/41875 324/512 |
| 2004/0201841 A1* | 10/2004 | Kim ........................ G01N 21/94 356/237.3 |
| 2005/0018182 A1* | 1/2005 | Hyun .................. G01N 21/9501 356/237.4 |
| 2014/0068925 A1 | 3/2014 | Park et al. |
| 2014/0368783 A1 | 12/2014 | Choi et al. |

FOREIGN PATENT DOCUMENTS

| JP | 2007-280833 | 10/2007 |
| JP | 2008-039444 | 2/2008 |
| JP | 2008-134238 | 6/2008 |

(Continued)

*Primary Examiner* — Selim Ahmed
(74) *Attorney, Agent, or Firm* — F. Chau & Associates, LLC

(57) ABSTRACT

A method for fabricating a substrate includes forming a first substrate including a thin film transistor array, and inspecting a first surface of an inspecting device, wherein inspecting the first surface of the inspection device includes: generating first measurement data by detecting a first measurement light that is parallel to a surface of an inspection region in the first surface, generating second measurement data by detecting a second measurement light that is parallel to the surface of the inspection region, and inspecting a state of a surface of the inspection region by comparing the first measurement data with the second measurement data.

17 Claims, 49 Drawing Sheets

(56) References Cited

FOREIGN PATENT DOCUMENTS

| | | |
|---|---|---|
| JP | 2008-151604 | 7/2008 |
| JP | 2009-174957 | 8/2009 |
| JP | 2014-059256 | 4/2014 |
| KR | 1999-017650 | 3/1999 |
| KR | 10-2008-0019395 | 3/2008 |
| KR | 10-2008-0062858 | 7/2008 |
| KR | 10-2008-0076195 | 8/2008 |
| KR | 10-1089059 | 12/2011 |
| KR | 10-2012-0005921 | 1/2012 |
| KR | 10-1115879 | 2/2012 |
| KR | 10-1288457 | 7/2013 |
| KR | 10-2014-0011777 | 1/2014 |
| KR | 10-1365821 | 2/2014 |

* cited by examiner

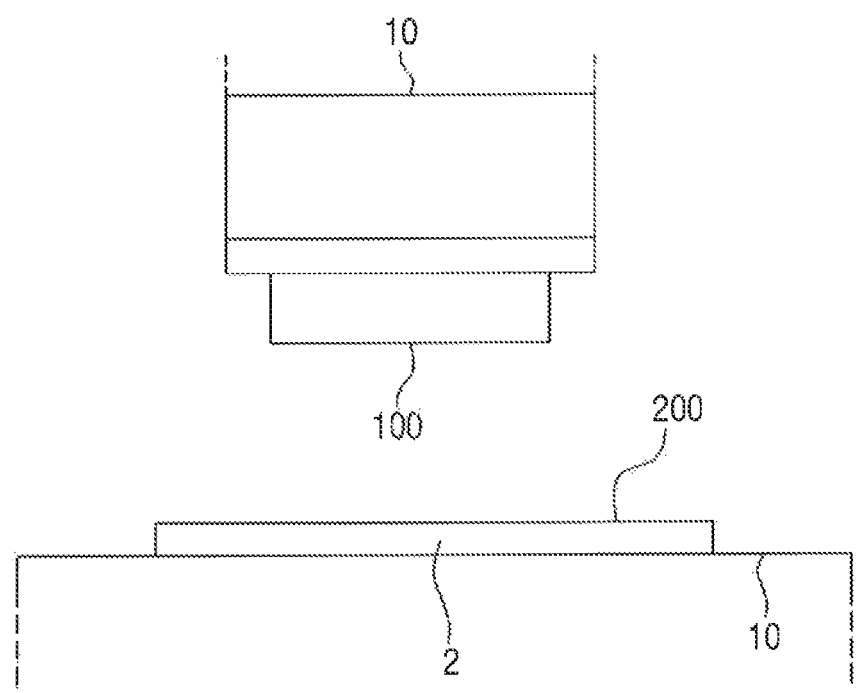

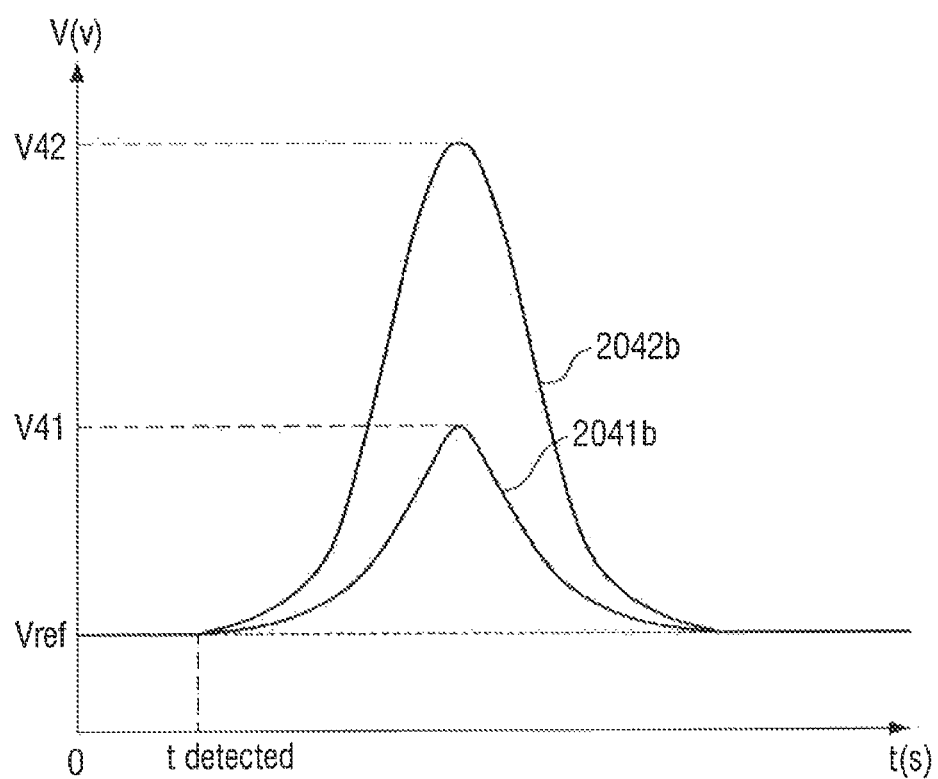

METHOD OF INSPECTING DEVICE USING FIRST MEASUREMENT AND SECOND MEASUREMENT LIGHTS

CROSS-REFERENCE TO RELATED APPLICATIONS

This application claims priority under 35 U.S.C. § 119 from, and the benefit of, Korean Patent Application No, 10-2015-0157543 filed on Nov. 10, 2015 in the Korean Intellectual Property Office, the contents of which are herein incorporated by reference in their entirety.

BACKGROUND

1. Technical Field

Embodiments of the present inventive concept are directed to a method for fabricating a substrate.

2. Discussion of the Related Art

Recently, with the subdivision and precision of a semiconductor fabricating process and a display manufacturing process, product reliability and production yield are more affected by defects that occur during the processes.

Accordingly, a more precise processing should be used to detect defects that occur before the semiconductor fabricating process and the display manufacturing process.

In general, in inspecting for foreign substances, it is possible to detect foreign substances present on a surface through a relatively simple configuration. However, in the case of micro-sized foreign substances, measured data thereof may include measurement errors.

SUMMARY

Embodiments of the present inventive concept can provide a method for fabricating a substrate, which can improve reliability of a surface inspection by compensating errors in measured data.

Embodiments of the present inventive concept can provide a method for fabricating a substrate, which can improve product production yield by determining sizes and positions of foreign substances present on a surface of an inspection region of a target of inspection.

However, embodiments of the present inventive concept are not restricted to those set forth herein. The above and other features of embodiments of the present inventive concept will become more apparent to one of ordinary skill in the art to which embodiments of the present inventive concept pertain by referencing the detailed description of exemplary embodiments of the present inventive concept given below.

According to an embodiment of the present inventive concept, there is provided a method for fabricating a substrate, comprising forming a first substrate that includes a thin film transistor array, and inspecting a first surface of an inspecting device, wherein inspecting the first surface of the inspection device includes: generating first measurement data by detecting a first measurement light that is parallel to a surface of an inspection region in the first surface, generating second measurement data by detecting a second measurement light that is parallel to the surface of the inspection region, and inspecting state of a surface of the inspection region through by comparing the first measurement data with the second measurement data.

In some embodiments of the present inventive concept, the second measurement light propagates in a direction opposite to the first measurement light.

In some embodiments of the present inventive concept, inspecting state of the surface of the inspection region comprises determining positions of foreign substances on the inspection region.

In some embodiments of the present inventive concept, the first measurement light and the second measurement light propagate in an x-axis direction, the inspection region includes a first region and a second region, a width of the first region in the x-axis direction is equal to a width of the second region in the x-axis direction, and determining the positions of the foreign substances includes determining which of the first region and the second region the foreign substances are positioned in.

In some embodiments of the present inventive concept, determining which of the first region and the second region the foreign substances are positioned in comprises determining that the foreign substances are positioned on a boundary between the first region and the second region, if a magnitude of the first measurement data is equal to a magnitude of the second measurement data, determining that the foreign substances are positioned in the first region, if the magnitude of the first measurement data is less than the magnitude of the second measurement data, and determining that the foreign substances are positioned in the second region, if the magnitude of the first measurement data is greater than the magnitude of the second measurement data.

In some embodiments of the present inventive concept, comparing the first measurement data with the second measurement data comprises comparing a magnitude of the first measurement data with a magnitude of the second measurement data.

In some embodiments of the present inventive concept, the first measurement light is emitted from a first light source, propagates through a first beam splitter and is incident to a first measurement sensor after passing the first surface, a propagation direction of the first measurement light is changed by 90° by the first beam splitter, the second measurement light is emitted from a second light source, propagates through a second beam splitter and is incident to a second measurement sensor after passing the first surface, and a propagation direction of the second measurement light is changed by 90° by the second beam splitter.

In some embodiments of the present inventive concept, the first measurement sensor and the second measurement sensor are respectively positioned on each side around a target of the inspection.

In some embodiments of the present inventive concept, the method comprises forming a second substrate by mounting a semiconductor chip that drives the thin film transistor array of the first substrate, wherein the second substrate includes a second surface, loading the second substrate wherein the second surface faces the first surface on the inspection device, and inspecting the second surface of the second substrate using the inspection device.

According to another embodiment of the present inventive concept, there is provided a method for fabricating a substrate, comprising forming a first substrate that includes a thin film transistor array, and inspecting a first surface of an inspecting device, wherein inspecting the first surface of the inspection device includes: generating first measurement data by detecting a first measurement light that passes foreign substances on a surface of an inspection region in the first surface, generating second measurement data by detecting a second measurement light that passes the foreign substances and propagates in a direction opposite to that of the first measurement light and determining positions of the foreign substances by comparing the first measurement data with the second measurement data.

In some embodiments of the present inventive concept, the first measurement light and the second measurement light propagate in an x-axis direction, the inspection region includes a first region and a second region, a width of the first region in the x-axis direction is equal to a width of the second region in the x-axis direction, and determining positions of foreign substances includes determining which of the first region and the second region the foreign substances are positioned in.

In some embodiments of the present inventive concept, determining which of the first region and the second region the foreign substances are positioned in comprises determining that the foreign substances are positioned on a boundary between the first region and the second region, if a magnitude of the first measurement data is equal to a magnitude of the second measurement data, determining that the foreign substances are positioned in the first region, if the magnitude of the first measurement data is less than the magnitude of the second measurement data, and determining that the foreign substances are positioned in the second region if the magnitude of the first measurement data is greater than the magnitude of the second measurement data.

In some embodiments of the present inventive concept, comparing the first measurement data with the second measurement data comprises comparing a magnitude of the first measurement data with a magnitude of the second measurement data.

In some embodiments of the present inventive concept, the first measurement light is emitted from a first light source, propagates through a first beam splitter and is incident to a first measurement sensor after passing the first surface, a propagation direction of the first measurement light is changed by 90° by the first beam splitter, the second measurement light is emitted from a second light source, propagates through a second beam splitter and is incident to a second measurement sensor after passing the first surface, and a propagation direction of the second measurement light is changed by 90° the second beam splitter.

In some embodiments of the present inventive concept, the first measurement sensor and the second measurement sensor are respectively positioned on each side of a target of the inspection.

According to another embodiment of the present inventive concept, there is provided a method for fabricating a substrate, comprising inspecting a first surface of an inspecting device, including generating first measurement data by detecting a first measurement light that is parallel to a surface of an inspection region in the first surface, wherein the inspection region includes a first region and a second region, generating second measurement data by detecting a second measurement light that is parallel to the surface of the inspection region, and determining which of the first region and the second region the foreign substances are positioned in by comparing a magnitude of the first measurement data with a magnitude of the second measurement data.

In some embodiments of the present inventive concept, determining which of the first region and the second region the foreign substances are positioned in includes determining that the foreign substances are positioned on a boundary between the first region and the second region, if the magnitude of the first measurement data is equal to the magnitude of the second measurement data, determining that the foreign substances are positioned in the first region, if the magnitude of the first measurement data is less than the magnitude of the second measurement data, and determining that the foreign substances are positioned in the second region, if the magnitude of the first measurement data is greater than the magnitude of the second measurement data.

In some embodiments of the present inventive concept, the method includes forming a first substrate that includes a thin film transistor array, forming a second substrate by mounting a semiconductor chip that drives the thin film transistor array of the first substrate, wherein the second substrate includes a second surface, loading the second substrate wherein the second surface faces the first surface on the inspection device, and inspecting the second surface of the second substrate using the inspection device.

In some embodiments of the present inventive concept, the first measurement light is emitted from a first light source, propagates through a first beam splitter and is incident to a first measurement sensor after passing the first surface, a propagation direction of the first measurement light is changed by 90° by the first beam splitter, the second measurement light is emitted from a second light source, propagates through a second beam splitter and is incident to a second measurement sensor after passing the first surface, a propagation direction of the second measurement light is changed by 90° by the second beam splitter, and the second measurement light propagates in a direction opposite to that of the first measurement light.

BRIEF DESCRIPTION OF THE DRAWINGS

FIGS. 2A and 2B are block diagrams of a substrate according to some embodiments of the present inventive concept.

FIGS. 16A to 16C are graphs that illustrate a method for fabricating a substrate according to some embodiments of the present inventive concept.

DETAILED DESCRIPTION OF EXEMPLARY EMBODIMENTS

Embodiments of the present inventive concept will now be described more fully hereinafter with reference to the accompanying drawings, in which exemplary embodiments of the disclosure are shown. Embodiments of this disclosure may, however, be embodied in different forms and should not be construed as limited to the exemplary embodiments set forth herein. Rather, these exemplary embodiments are provided so that this disclosure will be thorough and complete, and will fully convey the scope of the embodiments of the disclosure to those skilled in the art. The same reference numbers may indicate the same components throughout the specification. In the attached figures, the thickness of layers and regions may be exaggerated for clarity.

It will be understood that when an element or layer is referred to as being "connected to," or "coupled to" another element or layer, it can be directly connected to or coupled to another element or layer or intervening elements or layers may be present. It will also be understood that when a layer is referred to as being "on" another layer or substrate, it can be directly on the other layer or substrate, or intervening layers may also be present.

Hereinafter, a substrate according to some embodiments of the present inventive concept will be described with reference to FIGS. 1A and 1B.

Figure 1A:
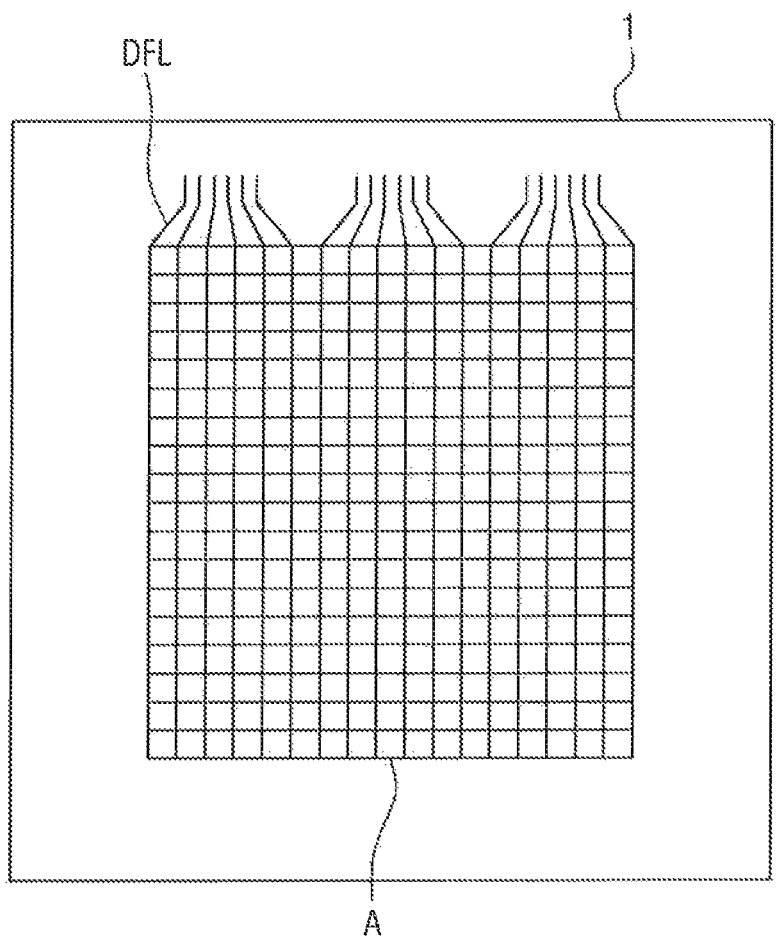
FIGS. 1A and 1B are layout diagrams of a substrate according to some embodiments of the present inventive concept.
Figure 1B:
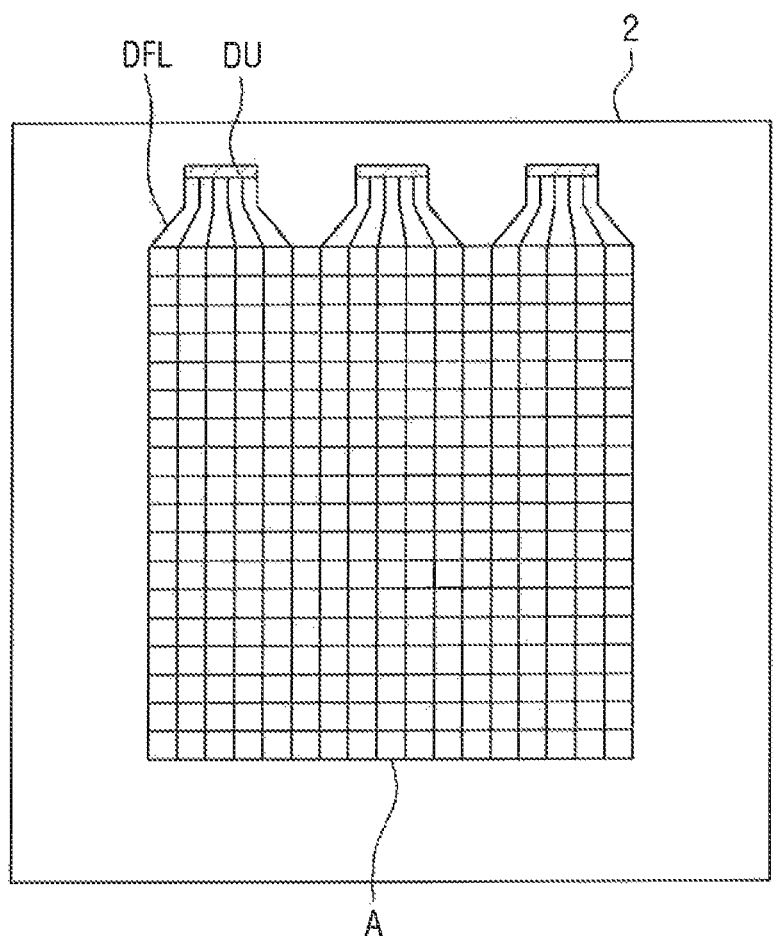

FIG. 1A is a layout diagram of a first substrate 1 according to some embodiments of the present inventive concept, and FIG. 1B is a layout diagram of a second substrate 2 according to some embodiments of the present inventive concept.

Referring to FIGS. 1A and 1B, a thin film transistor array A and a plurality of data fan out lines DFL are formed on the first substrate 1. Further, on the first substrate 2, a plurality of data drivers DU are mounted.

The first substrate 1 and the second substrate 2 may be formed of a heat-resistant and permeable material. For example, the first substrate 1 and the second substrate 2 may be formed of glass or plastic, but embodiments are not limited thereto.

According to some embodiments, the plurality of data drivers DU provide data signals to the thin film transistor array A. The plurality of fan out lines DFL transmit signals received from the data drivers DU to the thin film transistor array A.

Hereinafter, referring to FIGS. 2A and 2B, a method for fabricating a substrate according to some embodiments of the present inventive concept will be described.

Figure 2A:
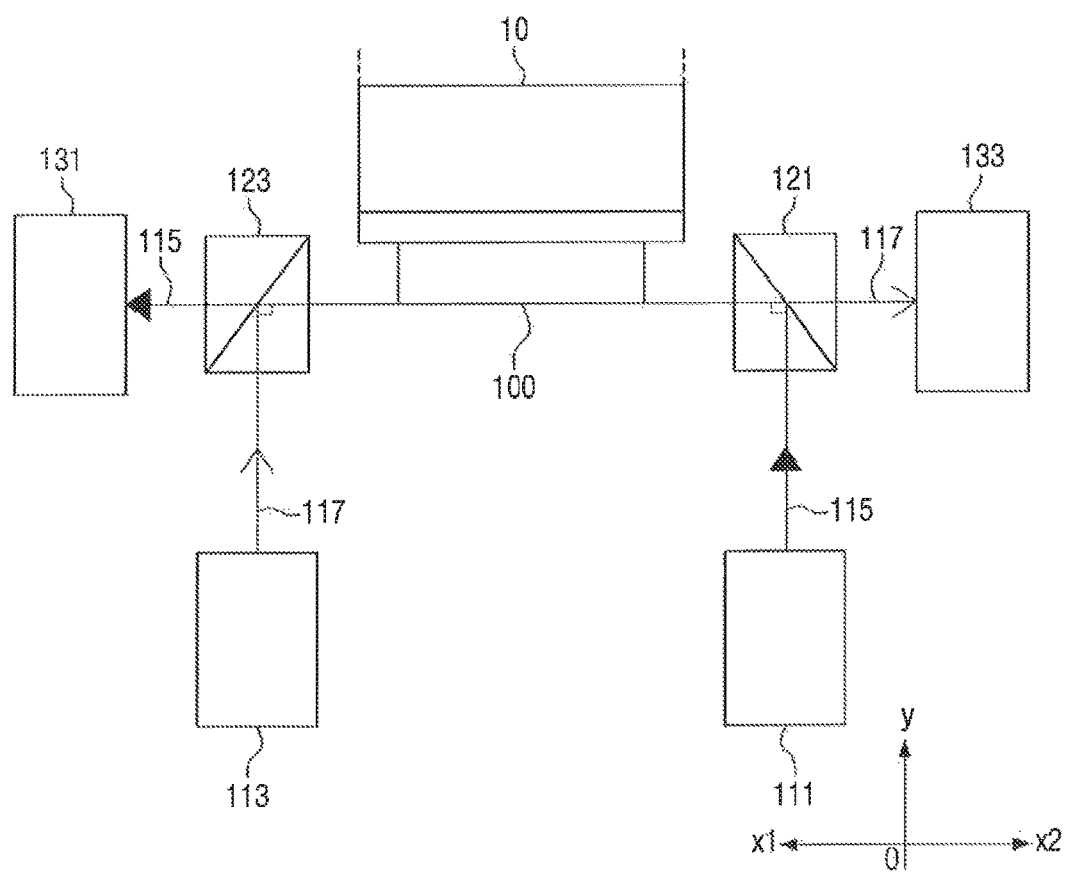

FIGS. 2A and 2B are exemplary block diagram of an inspection device 10 that illustrate a method for fabricating a substrate according to some embodiments of the present inventive concept.

Referring to FIGS. 2A and 2B, a method for fabricating a substrate according to some embodiments of the present inventive concept includes inspecting a first surface 100 of an inspection device 10 before loading the second substrate 2 onto the inspection device 10.

According to some embodiments, inspection of the first surface 100 of the inspection device 10 can be performed using a surface inspection device that includes a first light source 111, a second light source 113, a first beam splitter 121, a second beam splitter 123, a first measurement sensor 131, and a second measurement sensor 133. However, constituent elements of the surface inspection device according to embodiments of the present inventive concept are not limited thereto, and other constituent elements may be added or excluded.

In some embodiments of the present inventive concept, the inspection device 10 is an electro-optic light modulator, but embodiments are not limited thereto. The first surface 100 of the inspection device 10 may be, for example, a reflective film attached to a lower end portion of the electro-optic light modulator.

According to some embodiments, the first light source 111 irradiates the first beam splitter 121 with a first measurement light 115. That is, the first light source 111 emits the first measurement light 115. The second light source 113 irradiates the second beam splitter 123 with a second measurement light 117. That is, the second light source 113 emits the second measurement light 117.

The first light source 111 and the second light source 113 may be various kinds of lamps that emit light. The first light source 111 and the second light source 113 may be LED (Light Emitting Diode) lamps, tungsten halogen lamps, or xenon lamps, but embodiments are not limited thereto. For example, the first light source 111 and the second light source 113 may be laser light sources. In this case, the first light source 111 and the second light source 113 may be helium-neon (HeNe) lasers, argon (Ar) lasers, or LDs (Laser Diodes) having various wavelengths, but embodiments are not limited thereto. Further, the first light source 111 and the second light source 113 may be different kinds of light sources.

According to some embodiments, the first beam splitter 121 changes a path of the first measurement light 115 received from the first light source 111. The path-altered first measurement light 115 is incident to the first measurement sensor 131 through the first surface 100 of the inspection device 10. In some embodiments, the propagation direction of the first measurement light 115 is changed by 90° by the first beam splitter 121. The second beam splitter 123 also changes a path of the second measurement light 117 received from the second light source 113. The path-altered second measurement light 117 is incident to the second measurement sensor 133 through the first surface 100 of the inspection device 10, in some embodiments, the propagation direction of the second measurement light 117 is changed by 90° by the second beam splitter 123.

According to some embodiments, the first beam splitter 121 reflects a part of the first measurement light 115 and transmits the remainder of the first measurement light 115. The second beam splitter 123 reflects a part of the second measurement light 117 and transmits the remainder of the second measurement light 117.

For example, the first beam splitter 121 may reflect 50% of the first measurement light 115 received from the first light source 111, and transmits the remaining 50% thereof. That is, 50% of the first measurement light 115 received from the first light source 111 is reflected by the first beam splitter 121 across the first surface 100 of the inspection device 10.

In the same manner, the second beam splitter 123 may reflect, for example, 50% of the second measurement light 117 received from the second light source 113, and transmits the remaining 50% thereof. That is, 50% of the second measurement light 117 received from the second light source 113 is reflected by the second beam splitter 123 across the first surface 100 of the inspection device 10.

According to some embodiments, it is assumed that the first measurement light 115 and the second measurement light 117 are respectively reflected and transmitted through the first beam splitter 121 and the second beam splitter 123. Specifically, according to some embodiments, 50% of the first measurement light 115 received from the first light source 111 and 50% of the second measurement light 117 received from the second light source 113 are transmitted, and the remainders thereof are reflected, but embodiments are not limited thereto. If a part of the first measurement light 115 is absorbed by the first beam splitter 121 and a part of the second measurement light 117 is absorbed by the second beam splitter 123, the reflection ratios and permeation ratios of the first and second measurement lights 115 and 117 may be less than 50%.

According to some embodiments, the reflection angle of the first beam splitter 121 and the reflection angle of the second beam splitter 123 are perpendicular to the incident direction of the first measurement light 115 and the incident direction of the second measurement light 117, but embodiments are not limited thereto.

For example, if the propagation direction of the first measurement light 115 when emitted from the first light source 111 to the first beam splitter 121 is the y-axis direction, the propagation direction of the first measurement light 115 after being reflected by the first beam splitter 121 is the negative x-axis direction x1.

Similarly, for example, if the propagation direction of the second measurement light 117 when emitted from the second light source 113 to the second beam splitter 123 is the y-axis direction, the propagation direction of the second measurement light 117 after being reflected by the second beam splitter 123 is the positive x-axis direction x2.

In this case, the positive x-axis direction x2 and the negative x-axis direction x1 are opposite to each other. In this case, the first measurement light 115 propagates in a direction opposite to the second measurement light 117.

According to some embodiments, the first measurement light 115 and the second measurement light 117 propagate in opposite directions on the first surface 100 of the inspection device 10. In the drawing, the propagation paths of the first measurement light 115 and the second measurement light 117 are illustrated as one straight line. However, this is for convenience in explanation, but does not mean that the two light beams are joined. That is, the first measurement light 115 and the second measurement light 117 propagating in opposite directions on the first surface 100 may be shown as different paths.

According to some embodiments, the first measurement light 115 reflected by the first beam splitter 121 is incident to the first measurement sensor 131 after passing the first surface of the inspection device 10. The second measurement light 117 reflected by the second beam splitter 123 is also incident to the second measurement sensor 133 after passing the first surface 100 of the inspection device 10.

That is, the first measurement sensor 131 receives the first measurement light 115 reflected by the first beam splitter 121 and passing the first surface 100 of the inspection device 10. Similarly, the second measurement sensor 133 receives the second measurement light 117 reflected by the second beam splitter 123 and passing the first surface 100 of the inspection device 10.

If foreign substances are present on the first surface 100 of the inspection device 10, the first measurement light 115 and the second measurement light 117 may be scattered. In this case, the intensity of the first measurement light 115 incident to the first measurement sensor 131 after passing the first surface 100 of the inspection device 10 may change. Similarly, the intensity of the second measurement light 117 incident to the second measurement sensor 133 after passing the first surface 100 of the inspection device 10 may change.

For example, if foreign substances are present on the first surface 100 of the inspection device 10, the intensities of the first measurement light 115 incident to the first measurement sensor 131 and the second measurement light 117 incident to the second measurement sensor 133 may be 25% of the intensities initially emitted from the first light source 111 and the second light source 113, respectively. However, embodiments of the present disclosure are not limited thereto, and the incidence ratio of the first measurement light 115 to the first measurement sensor 131 and the incidence ratio of the second measurement light 117 to the second measurement sensor 133 may be higher than 25% or may be lower than 25%.

The first measurement light 115 and the second measurement light 117 propagate parallel to the first surface 100 of the inspection device 10.

According to some embodiments, the first measurement sensor 131 and the second measurement sensor 133 respectively sense the first measurement light 115 and the second measurement light 117 to generate electrical signals. That is, the first measurement sensor 131 and the second measurement sensor 133 respectively sense optical signals to generate electrical signals. Specifically, the first measurement sensor 131 and the second measurement sensor 133 may include phototransistors and photodiodes, such as PIN diodes or APD diodes, but embodiments are not limited thereto.

According to some embodiments, the first measurement sensor 131 that detects the optical signal can sense an intensity change of the first measurement light 115 reflected by the first beam splitter. Similarly, the second measurement sensor 133 can sense an intensity change of the second measurement light 117 reflected by the second beam splitter 123.

In some embodiments of the present inventive concept, the first measurement sensor 131, the first surface 100 of the inspection device 10, and the second measurement sensor 133 may be arranged in line in x-axis direction. For example, the first measurement sensor 131 and the second measurement sensor 133 may be respectively disposed on each side of the inspection device 10.

In this case, the first beam splitter 121 is positioned, for example, between the second measurement sensor 133 and the first surface 100 of the inspection device 10, and the second beam splitter 123 is positioned, for example, between the first measurement sensor 131 and the first surface 100 of the inspection device 10.

According to some embodiments, the first light source 111 is positioned, for example, on a lower side of the first beam splitter 121, and the second light source 113 is positioned, for example, on a lower side of the second beam splitter 123.

According to some embodiments, the first measurement light 115 is emitted from the first light source 111 and reflected by the first beam splitter 121. The first measurement light 115 reflected by the first beam splitter 121 is incident to the first measurement sensor 131 after passing the first surface 100 of the inspection device 10.

According to some embodiments, the second measurement light 117 is emitted from the second light source 113 and reflected by the second beam splitter 123. The second measurement light 117 reflected by the second beam splitter 123 is incident to the second measurement sensor 133 after passing the first surface 100 of the inspection device 10.

However, embodiments of the present disclosure are not limited thereto. If the first measurement light 115 incident to the first measurement sensor 131 and the second measurement light 117 incident to the second measurement sensor 133 propagate in opposite directions, the first measurement sensor 131, the second measurement sensor 133, the first beam splitter 121, the second beam splitter 122, the first light source 111, and the second light source 113 can be arranged so that the first measurement light 115 and the second measurement light 117 can be received without interfering with each other.

Further, if the above-described constituent elements are arranged so that the first measurement light 115 and the second measurement light 117 can be received without interfering with each other, at least one of the first measurement sensor 131, the second measurement sensor 133, the first beam splitter 121, the second beam splitter 122, the first light source 111, and the second light source 113 may be omitted or added.

The details of a method for inspecting the first surface 100 of the inspection device 10 will be described later.

A method for fabricating a substrate according to some embodiments of the present inventive concept includes loading a second substrate 2 that includes a second surface 200 on the inspection device 10 after inspecting the first surface 100 of the inspection device 10. In this case, the first surface 100 and the second surface 200 face each other.

Further, a method for fabricating a substrate according to some embodiments of the present inventive concept includes inspecting the second surface 200 of the second substrate 2 using the inspection device 10.

According to some embodiments, inspecting the second surface 200 of the second substrate 2 includes detecting the presence of foreign substances on the second surface 200.

Hereinafter, referring to FIG. 3, a method for fabricating a substrate according to some embodiments of the present inventive concept will be described. For clarity of explanation, a duplicate description of components described above will be omitted, and only differences between embodiments will be described.

Figure 3:
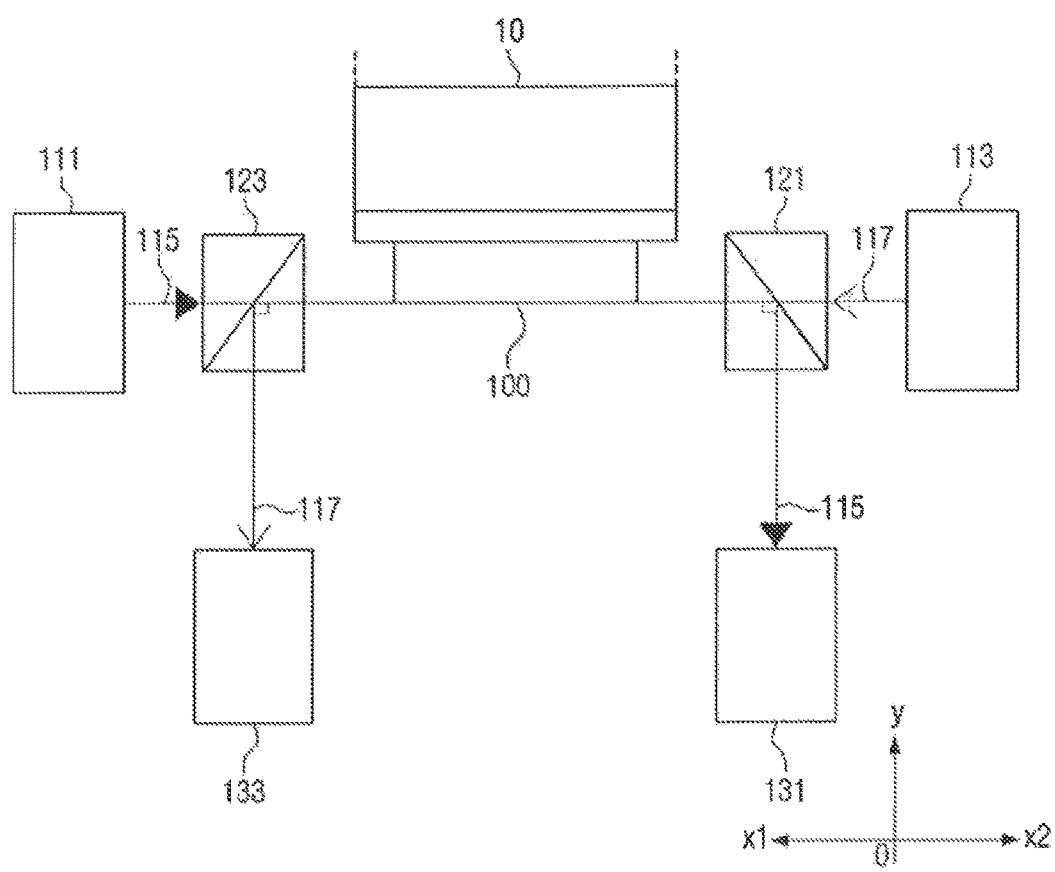
FIG. 3 is a block diagram of a substrate according to some embodiments of the present inventive concept.

FIG. 3 is an exemplary block diagram of a surface inspection device that illustrates a method for fabricating a substrate according to some embodiments of the present inventive concept.

Referring to FIG. 3, a surface inspection device according to some embodiments of the present inventive concept includes a first measurement sensor 131 and a second measurement sensor 133.

According to some embodiments, the first light source 111, the first surface 100 of the inspection device 10, and the second light source 113 are arranged in line in the x-axis direction. For example, the first light source 111 and the second light source 113 are respectively positioned on each side of the inspection device 10.

In this case, the first beam splitter 121 is positioned, for example, between the second light source 113 and the first surface 100 of the inspection device 10, and the second beam splitter 123 is positioned, for example, between the first light source 111 and the first surface 100 of the inspection device 10.

According to some embodiments, the first measurement sensor 131 is positioned, for example, below the first beam splitter 121, and the second measurement sensor 133 is positioned, for example, below the second beam splitter 123.

According to some embodiments, the first measurement light 115 emitted from the first light source 111 is reflected by the first beam splitter 121 after passing the first surface 100 of the inspection device 10. The reflected first measurement light 115 is incident to the first measurement sensor 131.

According to some embodiments, the second measurement light 117 emitted from the second light source 113 is reflected by the second beam splitter 123 after passing the first surface 100 of the inspection device 10. The reflected second measurement light 117 is incident to the second measurement sensor 133.

However, embodiments of the present disclosure are not limited thereto. If the first measurement light 115 incident to the first measurement sensor 131 and the second measurement light 117 incident to the second measurement sensor 133 propagate in opposite directions, the first measurement sensor 131, the second measurement sensor 133, the first beam splitter 121, the second beam splitter 122, the first light source 111, and the second light source 113 can be positioned so that the first measurement light 115 and the second measurement light 117 can be received without interfering with each other.

Hereinafter, referring to FIGS. 4A and 4B, a method for fabricating a substrate according to some embodiments of the present inventive concept will be described. For clarity of explanation, a duplicate description of components described above will be omitted, and only differences between embodiments will be described.

Figure 4A:
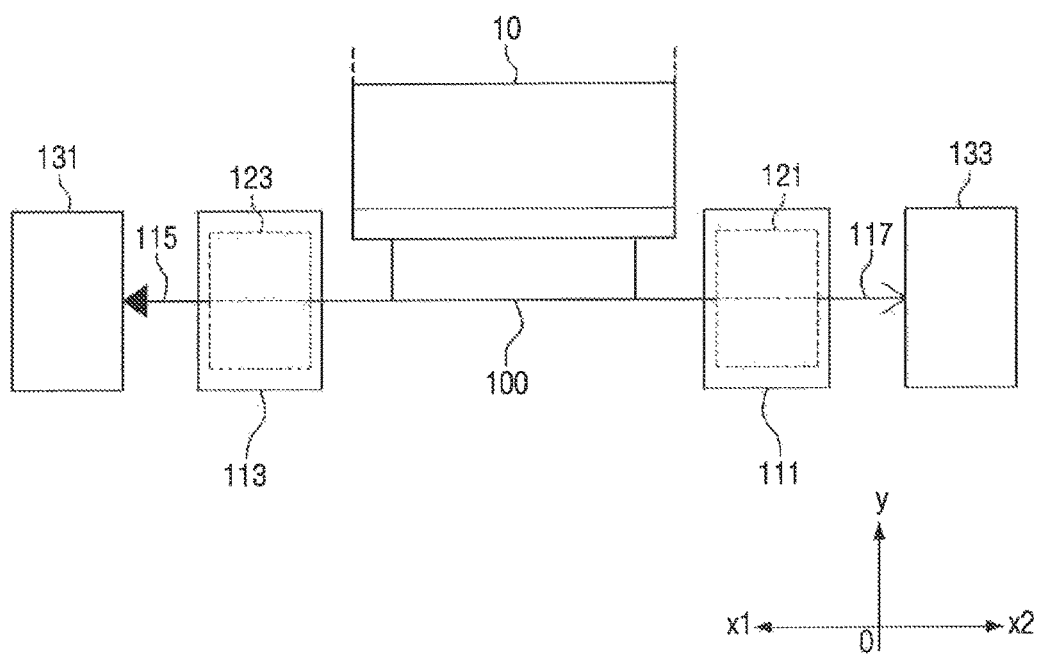
FIG. 4A is a block diagram of a substrate according to some embodiments of the present inventive concept.
Figure 4B:
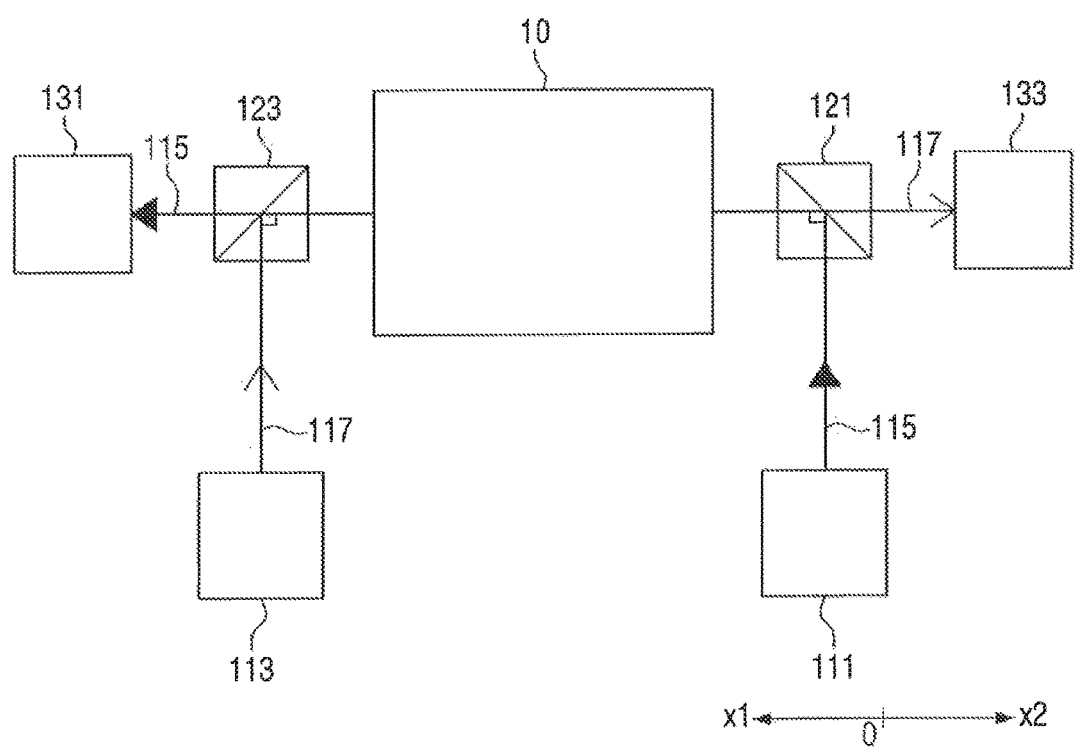
FIG. 4B is a plan view of FIG. 4A.

FIGS. 4A and 4B are exemplary block diagrams of a surface inspection device that illustrate a method for fabricating a substrate according to some embodiments of the present inventive concept. FIG. 4B is a plan view of FIG. 4A.

Referring to FIGS. 4A and 4B, the first light source 111 and the second light source 113 are positioned, for example, in the same plane as the plane of the first beam splitter 121 and the second beam splitter 123. For example, if the first measurement sensor 131 and the second measurement sensor 133 are respectively positioned on each side of the inspection device 10, the first light source 111 and the second light source 113 are also positioned in the same plane as the plane of the first measurement sensor 131 and the second measurement sensor 133.

However, embodiments of the present disclosure are not limited thereto. If the first measurement light 115 incident to the first measurement sensor 131 and the second measurement light 117 incident to the second measurement sensor 133 propagate in opposite directions, the first measurement sensor 131, the second measurement sensor 133, the first beam splitter 121, the second beam splitter 122, the first light source 111, and the second light source 113 can be positioned so that the first measurement light 115 and the second measurement light 117 can be received without interfering with each other.

Hereinafter, referring to FIGS. 5A and 5B, a method for fabricating a substrate according to some embodiments of the present inventive concept will be described. For clarity of explanation, a duplicate description of components described above will be omitted, and only differences between embodiments will be described.

Figure 5A:
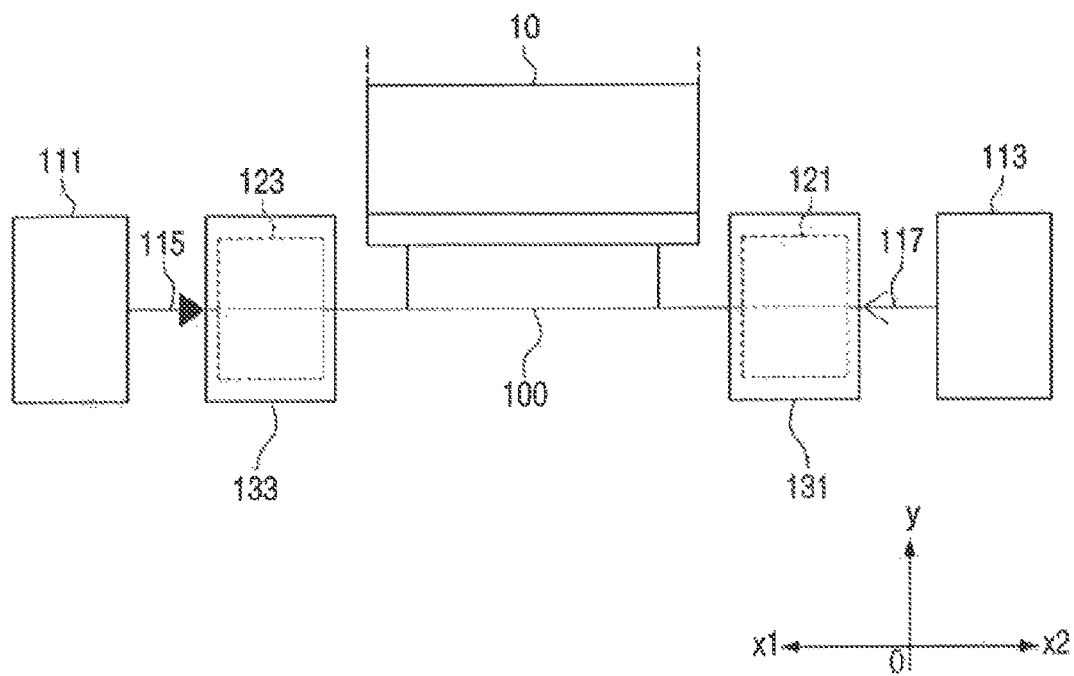
FIG. 5A is a block diagram of a substrate according to some embodiments of the present inventive concept.
Figure 5B:
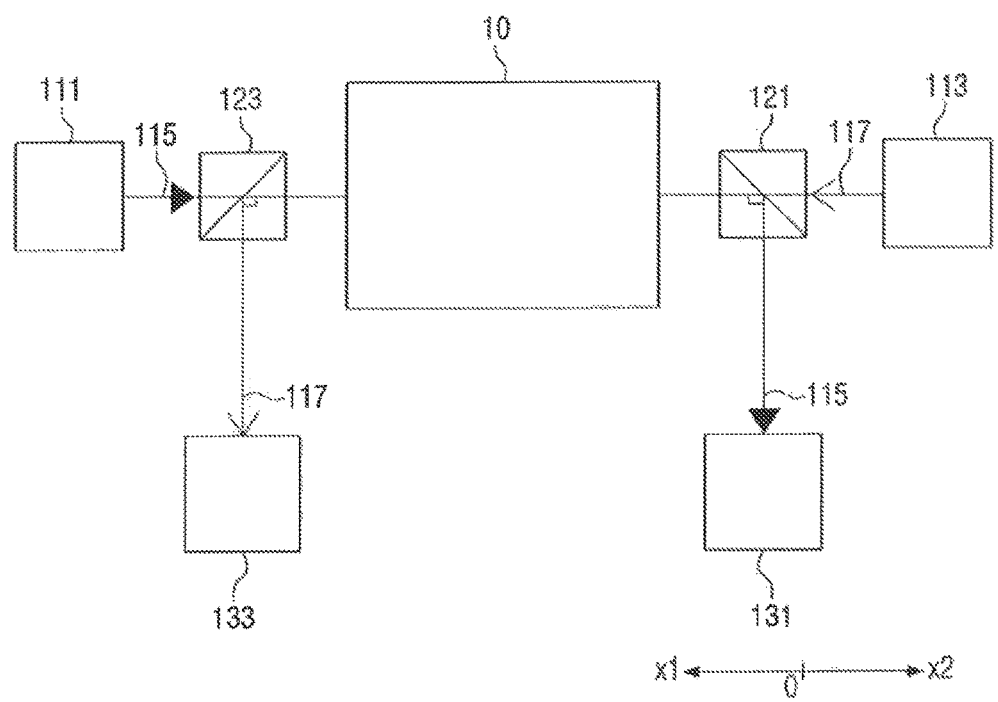
FIG. 5B is a plan view of FIG. 5A.

FIGS. 5A and 5B are exemplary block diagrams of a surface inspection device that illustrate a method for fabricating a substrate according to some embodiments of the present inventive concept. FIG. 5B is a plan view of FIG. 5A.

Referring to FIGS. 5A and 5B, the first measurement sensor 131 and the second measurement sensor 133 are positioned, for example, in the same plane as the plane of the first beam splitter 121 and the second beam splitter 123. For example, if the first light source 111 and the second light source 113 are respectively positioned on each side of the inspection device 10, the first measurement sensor 131 and the second measurement sensor 133 are also positioned in the same plane as the plane of the first light source 111 and the second light source 113.

However, embodiments of the present disclosure are not limited thereto, if the first measurement light 115 incident to the first measurement sensor 131 and the second measurement light 117 incident to the second measurement sensor 133 propagate in opposite directions, the first measurement sensor 131, the second measurement sensor 133, the first beam splitter 121, the second beam splitter 122, the first light source 111, and the second light source 113 can be positioned so that the first measurement light 115 and the second measurement light 117 can be received without interfering with each other.

Hereinafter, referring to FIGS. 2A and 6A to 6C, a method for fabricating a substrate according to some embodiments of the present inventive concept will be described. For clarity of explanation, a duplicate description of components described above will be omitted, and only differences between embodiments will be described.

Figure 6A:
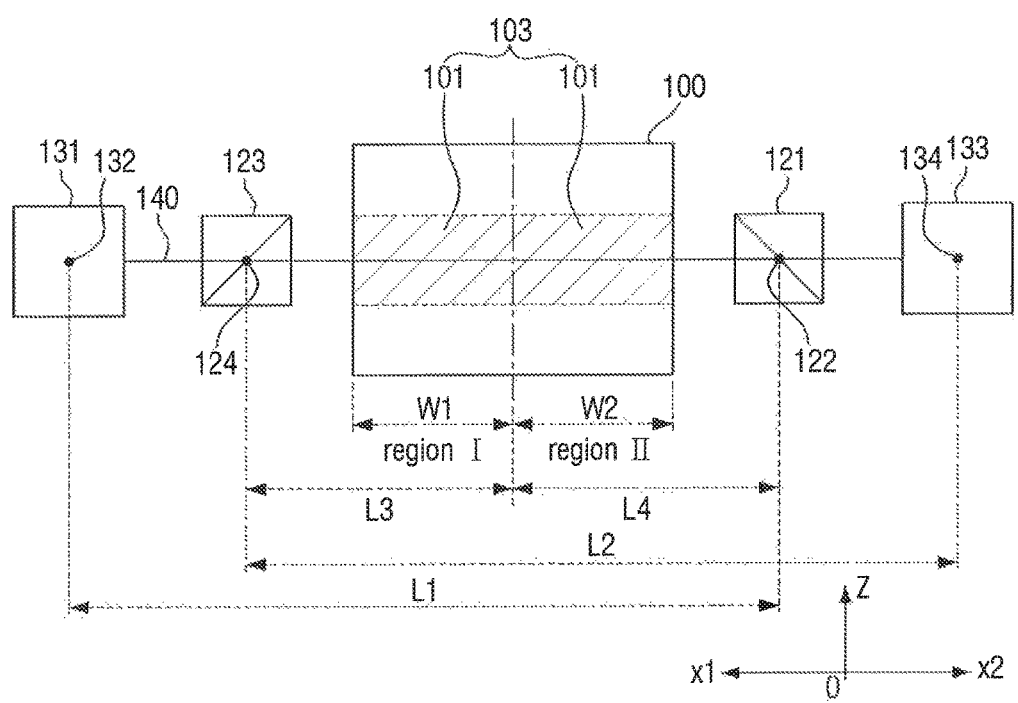
FIGS. 6A and 6B are bottom views of FIGS. 2A and 2B.
Figure 6B:
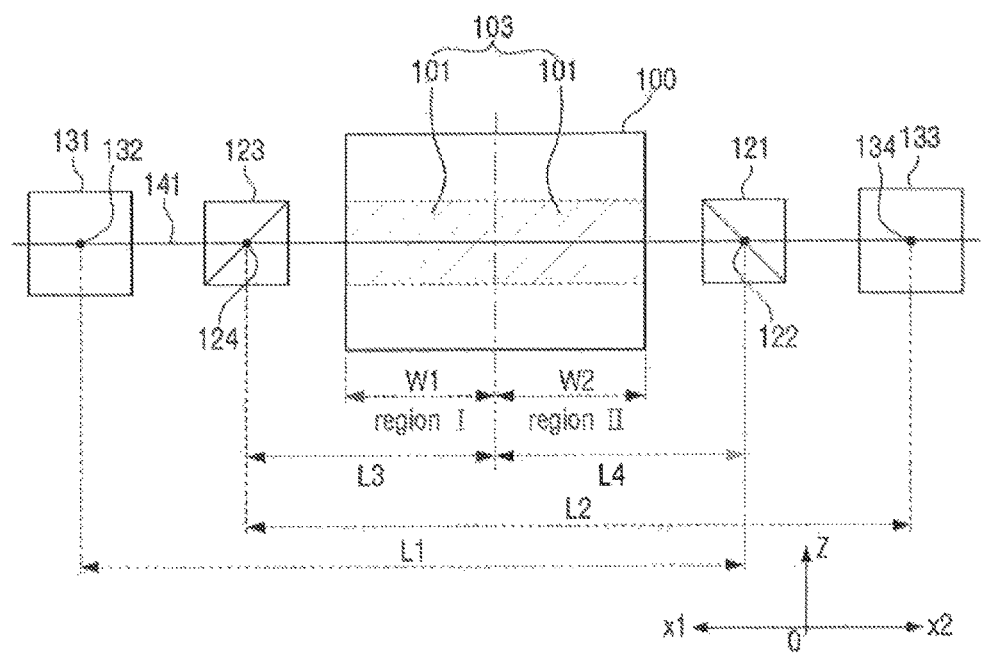
Figure 6C:
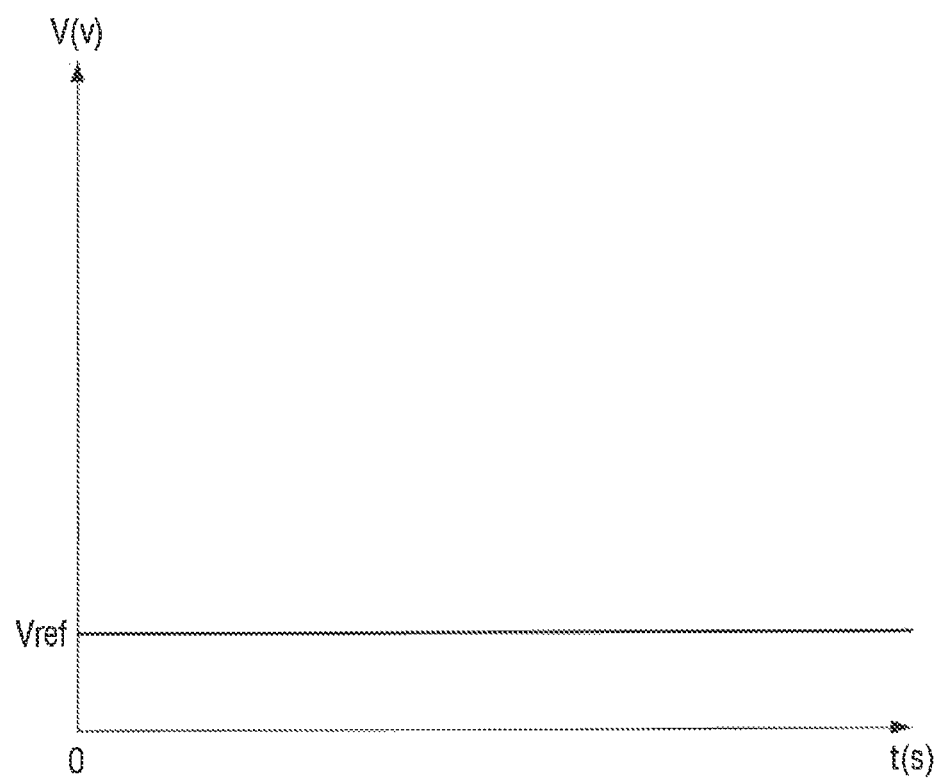
FIG. 6C is a graph that illustrates a method for fabricating a substrate according to some embodiments of the present inventive concept.

FIGS. 6A and 6B are bottom views of FIG. 2A, and FIG. 6C is a measurement graph at the first measurement sensor 131 and the second measurement sensor 133. For convenience in explanation, the first light source 111 and the second light source 113 will be omitted from the drawings.

Referring to FIGS. 2A and 6A to 6C, inspecting the first surface 100 of the inspection device 10 includes inspecting the state of a state of an inspection region 103 included in the first surface 100.

According to some embodiments, the inspection region 103 included in the first surface 100 includes a first region 101 and a second region 102.

If it is assumed that the propagation direction of the first measurement light 115 and the second measurement light 117 is along the x-axis direction, a width W1 of the first region 101 in the x-axis direction is equal to a width W2 of the second region 102 in the x-axis direction.

According to some embodiments, the first measurement light 115 and the second measurement light 117 propagate along a path 140 that passes the first measurement sensor 131, the second measurement sensor 133, the first beam splitter 121, the second beam splitter 123, and the inspection region 103. In this case, the first measurement light 115 and the second measurement light 117 propagate in opposite directions as described above.

The drawing depicts the first measurement sensor 131, the second measurement sensor 133, the first beam splitter 121, and the second beam splitter 123 as positioned on a line 141 that passes a center point 132 of the first measurement sensor 131, a center point 134 of the second measurement sensor 133, a center point 122 of the first beam splitter 121, and a center point 124 of the second beam splitter 123, but embodiments of the present disclosure are not limited thereto. For example, the respective constituent elements may be displaced from the line 141 so that the first measurement light 115 and the second measurement light 117 can be received without interfering with each other. In this case, the paths of the first measurement light 115 and the second measurement light 117 may different from each other.

Further, the drawing depicts the first measurement sensor 131 and the second measurement sensor 133 as being on either side of the inspection region 103. However, this is merely for convenience in explanation, and embodiments of the present disclosure are not limited thereto. For example, the first measurement sensor 131 may be replaced by the first light source 111, and the second measurement sensor 133 may be replaced by the second light source 113.

According to some embodiments, a length L1 between the center point 132 of the first measurement sensor 131 and the center point 122 of the first beam splitter 121 is, for example, equal to a length L2 between the center point 134 of the second measurement sensor 133 and the center point 124 of the second beam splitter 123.

According to some embodiments, a length L3 between the center point 122 of the first beam splitter 121 and a boundary between the first region 101 and the second region 102 is, for example, equal to a length L4 between the center point 124 of the second beam splitter 123 and the boundary between the first region 101 and the second region 102.

According to some embodiments, to inspect the state of the surface of the inspection region 103, the first measurement sensor 131 detects the first measurement light 115 that is parallel to the surface of the inspection region 103 to generate first measurement data. Further, the second measurement sensor 133 detects the second measurement light 117 that is parallel to the surface of the inspection region 103 to generate second measurement data. If foreign substances are present in the inspection region 103, the first measurement data is obtained by detecting first measurement light 115 that has passed the foreign substances. Similarly, the second measurements data is obtained by detecting the second measurement light 117 that has passed the foreign substances.

According to some embodiments, the inspection of the state of the surface of the inspection region 103 includes comparing the first measurement data with the second measurement data. The comparison of the first measurement data with the second measurement data may comparing the magnitude of the first measurement data with the magnitude of the second measurement data.

According to some embodiments, the inspection of the state of the inspection region 103 surface further includes determining the size and/or the positions of the foreign substances if the foreign substances are present in the inspection region 103.

In some embodiments, the determination of the size of the foreign substances includes, for example, estimating the size of the foreign substances by a calculation that considers diffusion angles of the first measurement light 115 and the second measurement light 117, distances between the first and second measurement sensors 131 and 133 and the first and second light sources 111 and 113, and the size of the foreign substances.

In some embodiments, the determination of the size of the foreign substances includes, for example, matching with a database of previously constructed lookup data of foreign substances having an actual unit standard.

According to some embodiments, the determination of the position of the foreign substances includes determining which of the first and second regions 101 and 102 of the inspection region 103 the foreign substances are positioned in.

Specifically, determining the position of the foreign substances includes determining that the foreign substances are positioned on the boundary between the first region 101 and the second region 102 if the magnitude of the first measurement data is equal to the magnitude of the second measurement data. If the magnitude of the first measurement data is less than the magnitude of the second measurement data, it is determined that the foreign substances are positioned in the first region 101. Further, if the magnitude of the first measurement data is greater than the magnitude of the second measurement data, it is determined that the foreign substances are positioned in the second region 102.

Referring to FIGS. 6A and 6B, if foreign substances are not present in the inspection region 103, the first measurement data is substantially equal to the second measurement data. For example, if no foreign substances are present in the inspection region 100, as shown in the graph of FIG. 6C, the magnitude Vref of the first measurement data may be equal to the magnitude Vref of the second measurement data.

In the graph of FIG. 6C, the x-axis represents time, and the y-axis represents a voltage or a conversion value.

Hereinafter, referring to FIGS. 7 to 9C, a method for fabricating a substrate according to some embodiments of the present inventive concept will be described. For clarity of explanation, a duplicate description of components described above will be omitted, and only differences between embodiments will be described.

Figure 7:
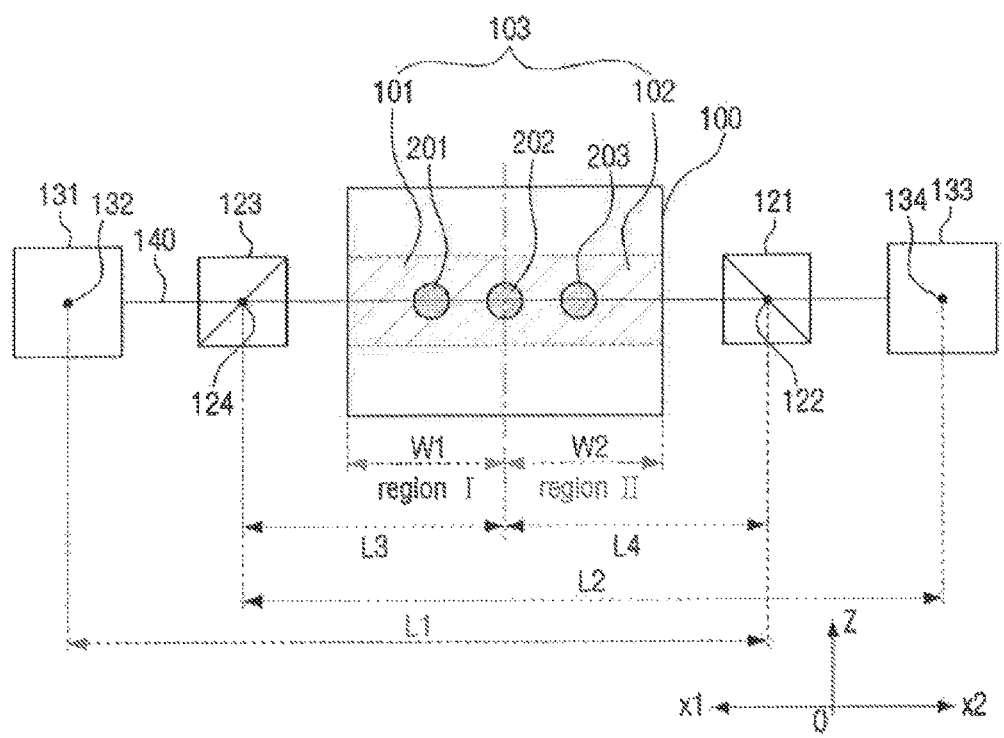
FIGS. 7 to 8C illustrate a method for fabricating a substrate according to some embodiments of the present inventive concept.

FIG. 7 is a bottom view of FIG. 2A, and is illustrates a case when foreign substances 201 to 203 are present on the first surface 100. In FIG. 7, it is assumed that the sizes of the foreign substances 201 to 203 are equal to each other. Further, in FIG. 7, the arrangement of the first measurement sensor 131, the second measurement sensor 133, the first beam splitter 121, and the second beam splitter 123 is exemplary. Further, for convenience of explanation, the first light source 111 and the second light source 113 are omitted. For convenience of explanation, the shapes of the foreign substances 201 to 203 are assumed to be circular, but the shapes are not limited thereto.

Figure 8A:
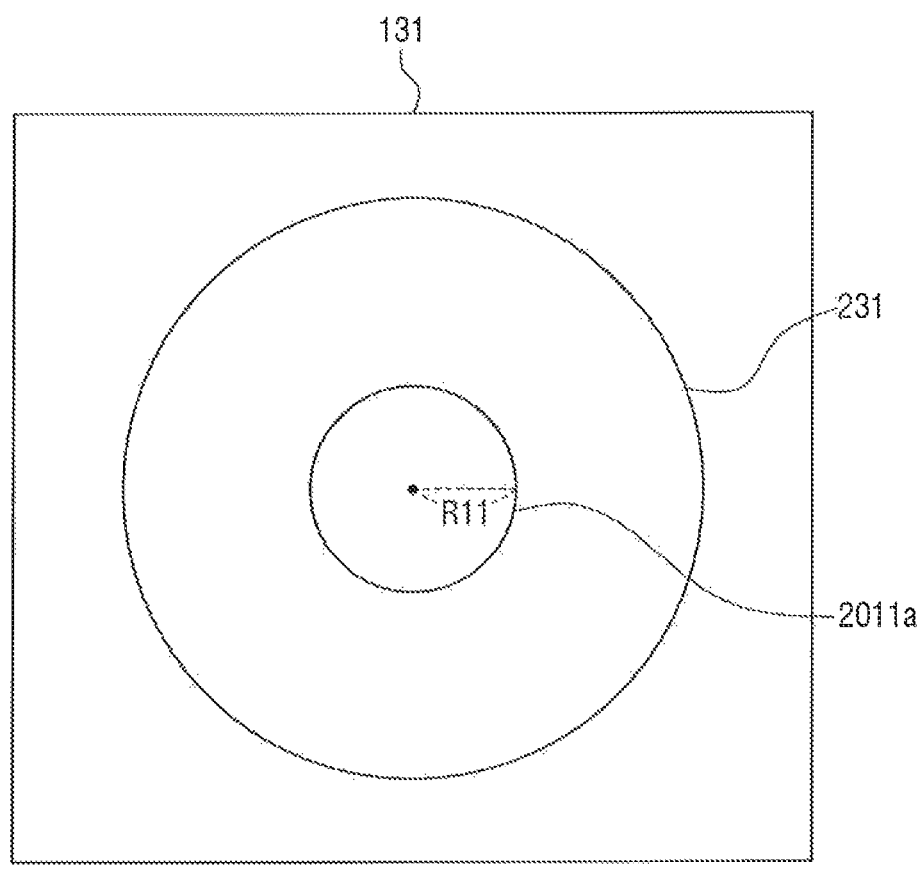
Figure 8B:
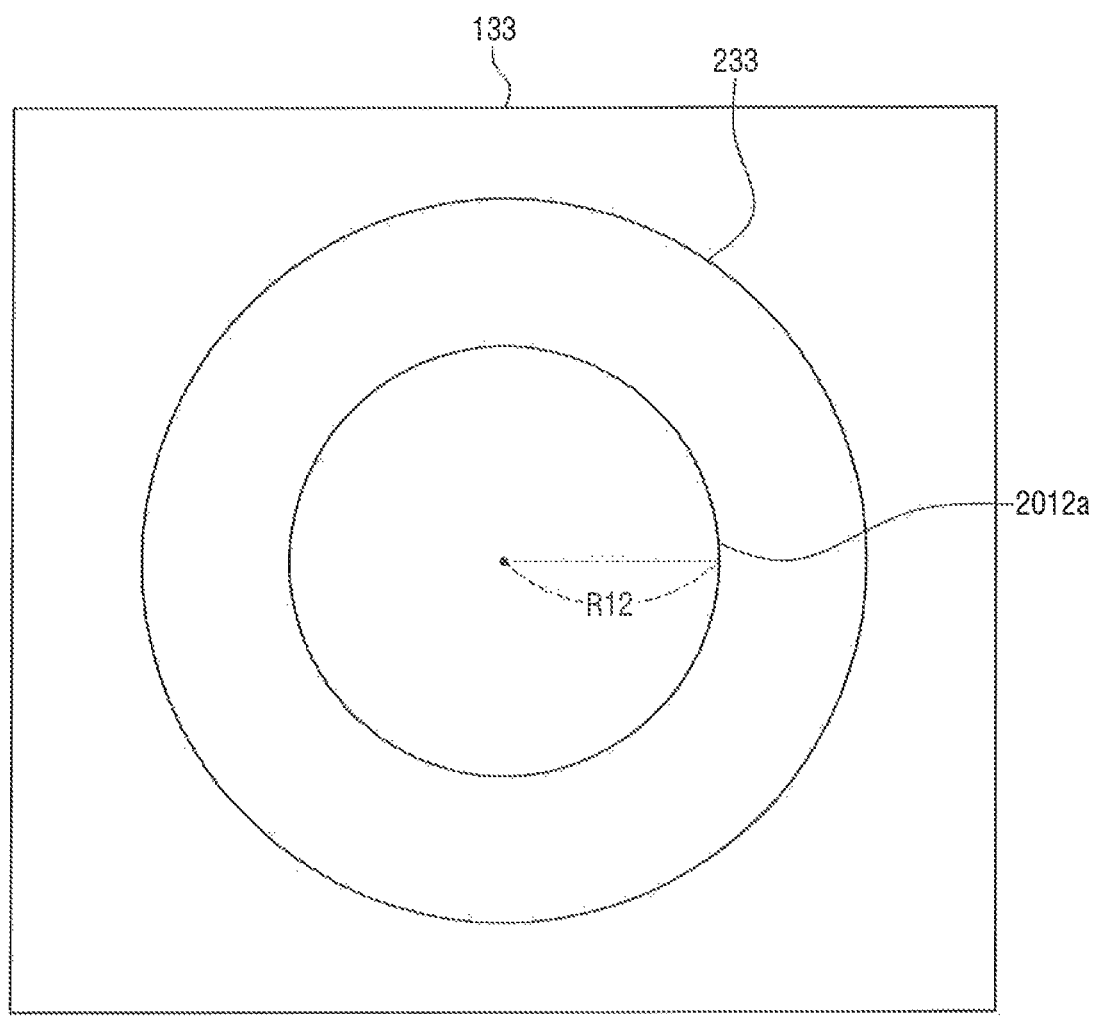
Figure 8C:
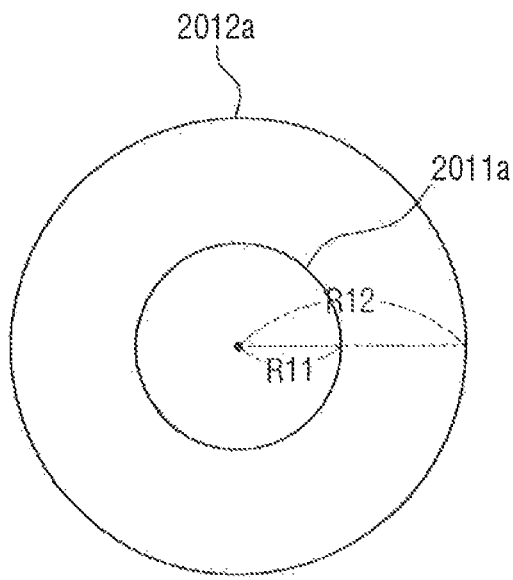
Figure 9A:
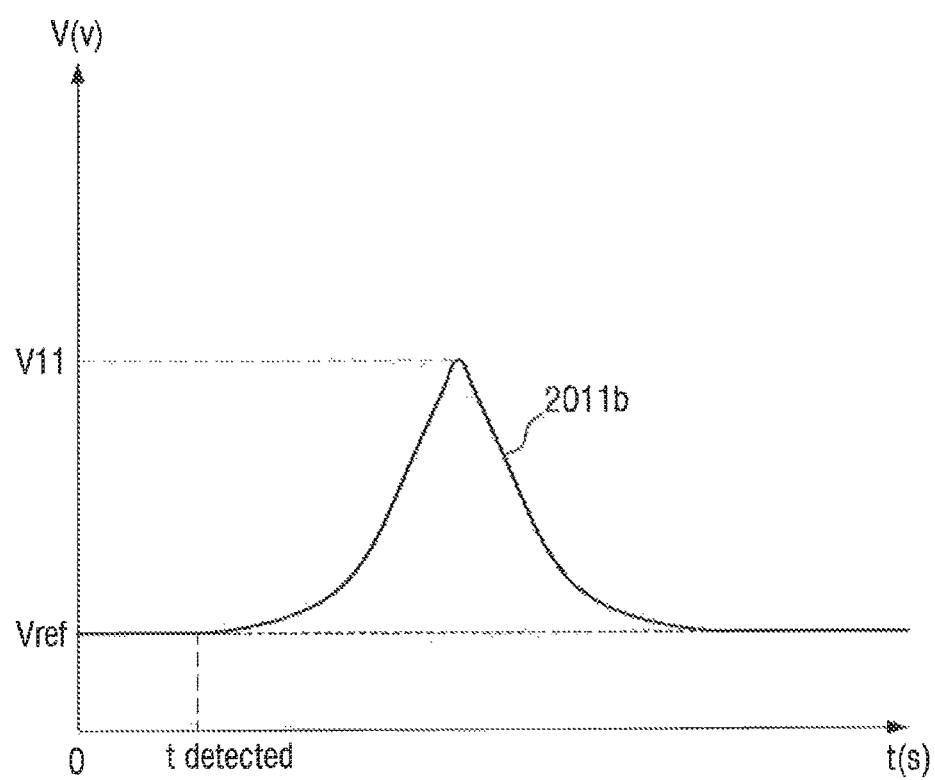
FIGS. 9A to 9C are graphs that illustrate a method for fabricating a substrate according to some embodiments of the present inventive concept.
Figure 9B:
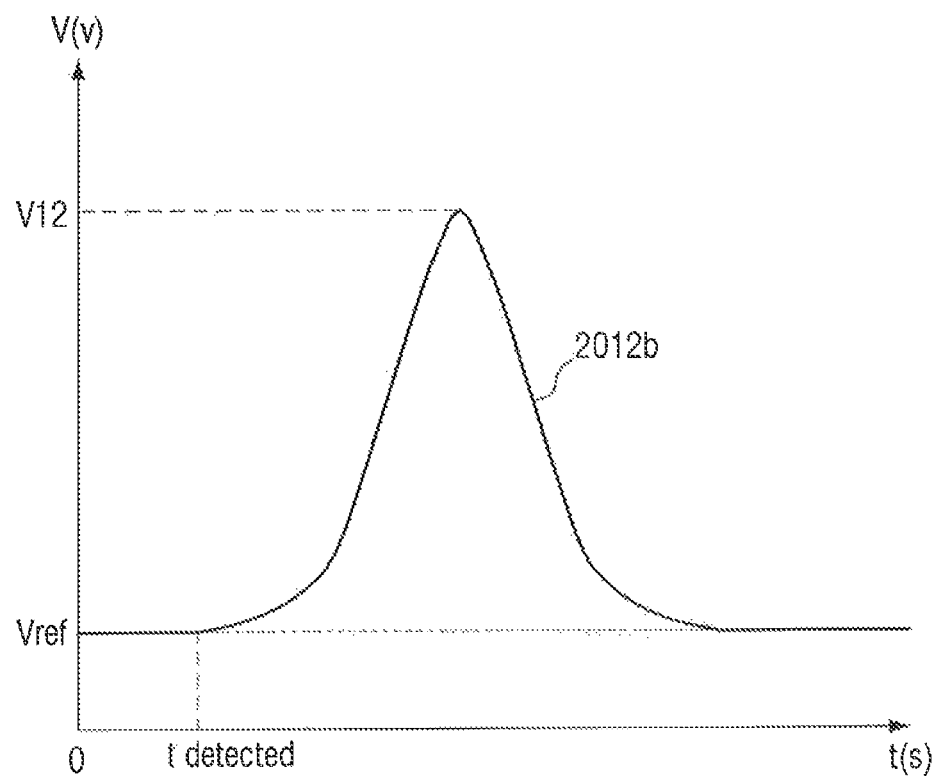

FIG. 8A illustrates an exemplary shadow 2011a measured by the first measurement sensor 131, and FIG. 9A is a graph of the first measurement data 2011b measured by the first measurement sensor 131. FIG. 8B illustrates an exemplary shadow 2012a measured by the second measurement sensor 133, and FIG. 9B is a graph of the second measurement data 2012b measured by the second measurement sensor 133. FIG. 8C illustrates a comparison of the shadow 2011a of the first measurement sensor 131 with the shadow 2012a of the second measurement sensor 133, and FIG. 9C is a graph of the comparison of the first measurement data 2011b with the second measurement data 2012b.

Figure 9C:
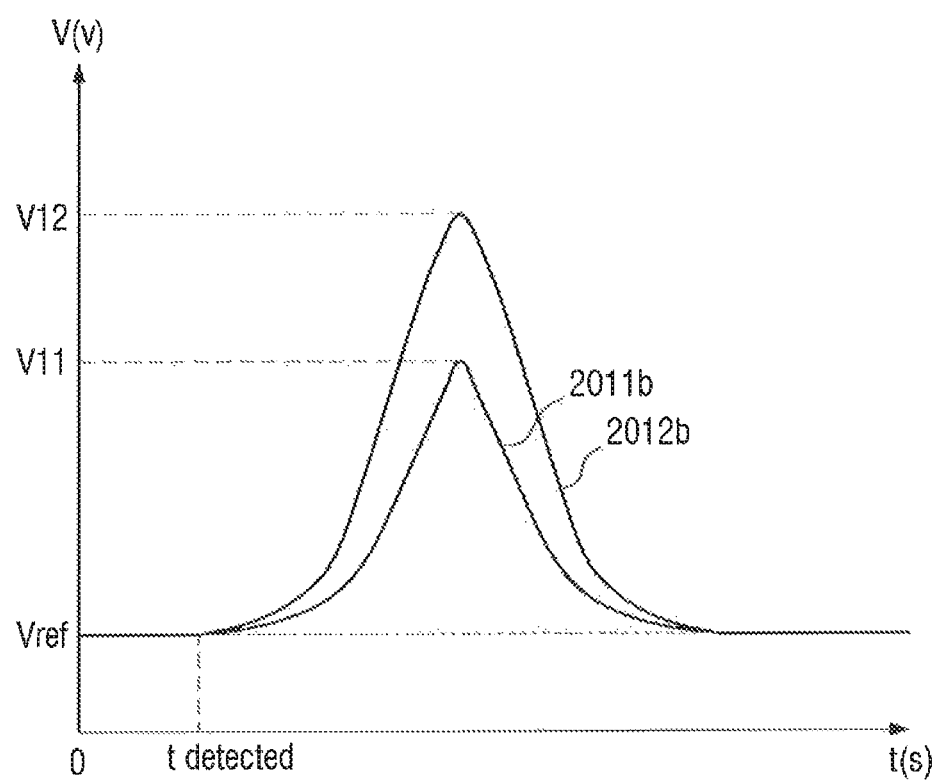

Referring to FIGS. 8 to 9C, the first foreign substance 201 is positioned in the first region 101.

According to some embodiments, the first region 101 is for example, a region closer to the first measurement sensor 131 than the second region 102. If the first foreign substance 201 is positioned in the first region 101, the diameter of the shadow 2011a measured by a light receiving portion 231 of the first measurement sensor 131 is R11. Similarly, the diameter of the shadow 2012a measured by a light receiving portion 233 of the second measurement sensor 133 is R12. In this case, since the first foreign substance 201 is positioned in the first region 101, R11 is less than R12.

Graph comparisons of the measurement data indicate that the magnitude V11 of the first measurement data 2011b is less than the magnitude V12 of the second measurement data 2012b. In the graphs of FIGS. 9A to 9C, the x-axis represents time, and the y-axis represents, for example, a voltage or a conversion value.

Since the diameter R11 of the shadow 2011a measured by the first measurement sensor 131 is less than the diameter R12 of the shadow 2012a measured by the second measurement sensor 133, it is determined that the first foreign substance 201 is positioned in the first region 101 that is close to the first measurement sensor 131. Further, since graph comparisons of the first measurement data 2011b and the second measurement data 2012b indicate that V11 is less than V12, it is determined that the first foreign substance 201 is positioned in the first region 101. Further, if the first foreign substance 201 is present in the inspection region 103, the graph changes from Vref, and thus the position of the first foreign substance 201 in the z-axis direction can be determined from $t_{detected}$.

Hereinafter, referring to FIGS. 7 and 10A to 11C, a method for fabricating a substrate according to some embodiments of the present inventive concept will be described. For clarity of explanation, a duplicate description of components described above will be omitted, and only differences between embodiments will be described.

Figure 10A:
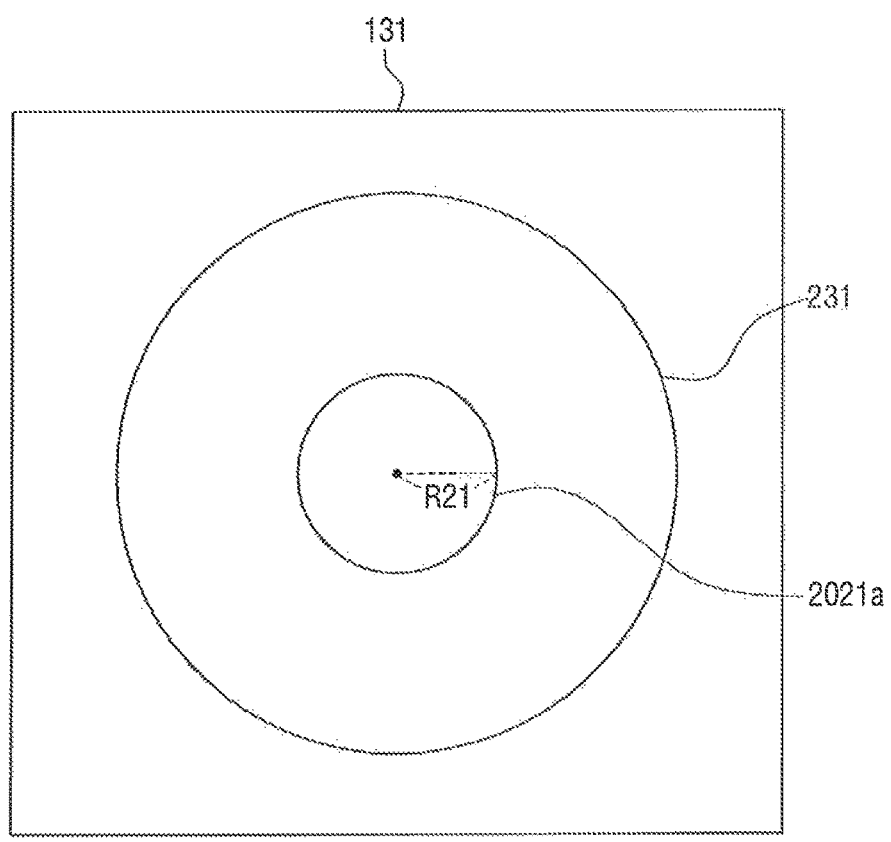
FIGS. 10A to 10C illustrate a method for fabricating a substrate according to some embodiments of the present inventive concept.
Figure 10B:
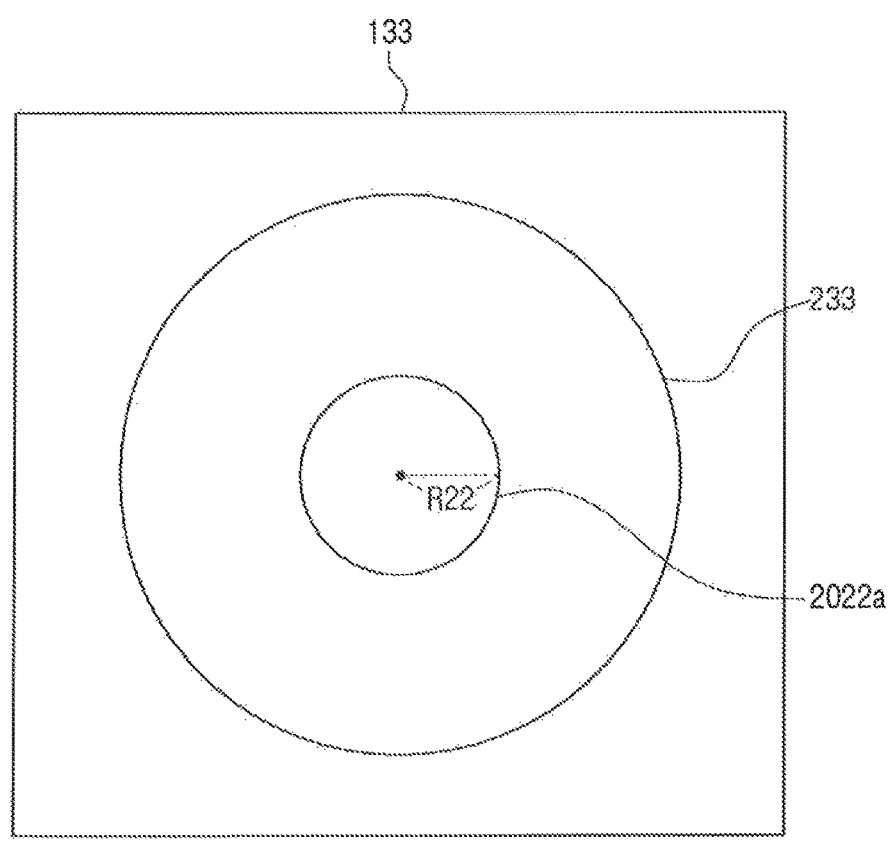
Figure 10C:
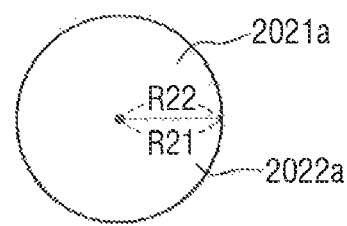
Figure 11A:
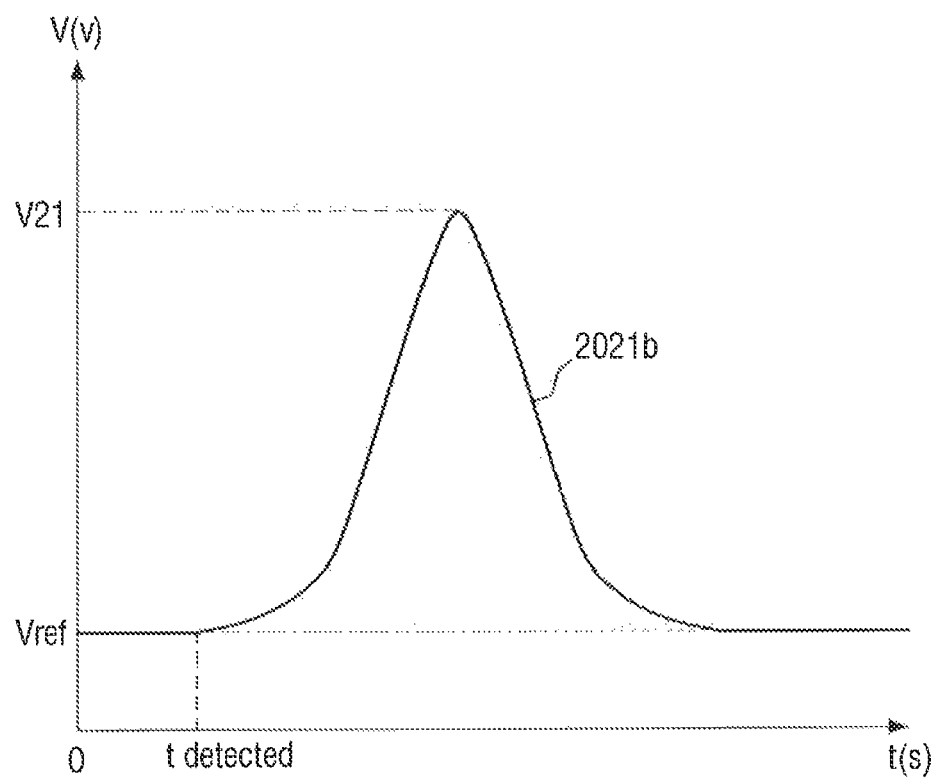
FIGS. 11A to 11C are graphs that illustrate a method for fabricating a substrate according to some embodiments of the present inventive concept.
Figure 11B:
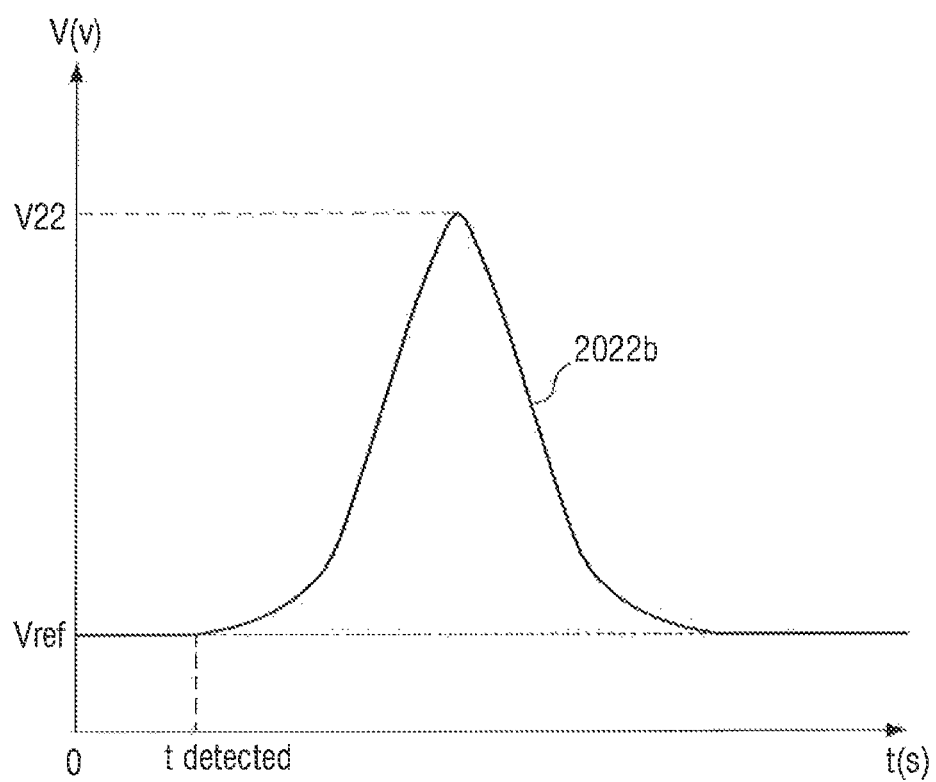
Figure 11C:
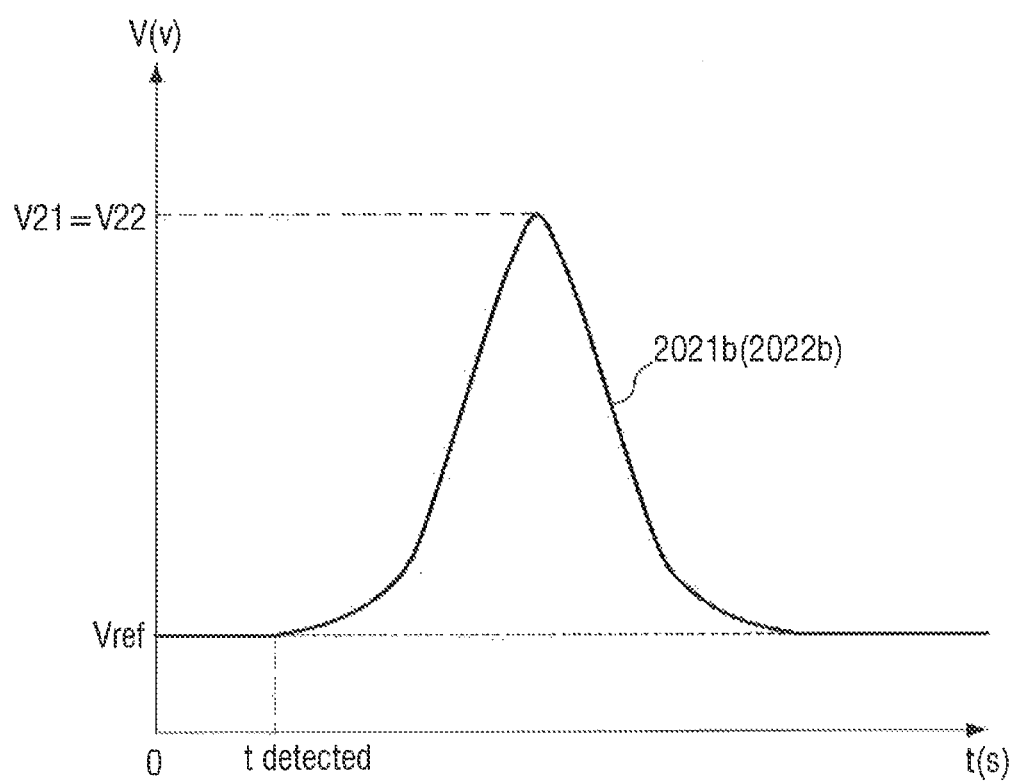

FIG. 10A illustrates an exemplary shadow 2021a measured by the first measurement sensor 131, and FIG. 11A is a graph of the first measurement data 2021b measured by a light receiving portion 231 of the first measurement sensor 131. FIG. 10B illustrates an exemplary shadow 2022a measured by a light receiving portion 233 of the second measurement sensor 133, and FIG. 11B is a graph of the second measurement data 2022b measured by the second measurement sensor 133. FIG. 10C illustrates a comparison of the shadow 2021a of the first measurement sensor 131 with the shadow 2022a of the second measurement sensor 133, and FIG. 11C is a graph of the comparison of the first measurement data 2021b with the second measurement data 2022b.

Referring to FIGS. 7 and 10A to 11C, the second foreign substance 202 is positioned on a boundary between the first region 101 and the second region 102.

If the second foreign substance 202 is positioned on the boundary between the first region 101 and the second region 102, the diameter of the shadow 2021a measured by the first measurement sensor 131 is R21. Similarly, the diameter of the shadow 2022a measured by the second measurement sensor 133 is R22. In this case, since the first foreign substance 201 is positioned on the boundary between the first region 101 and the second region 102, R21 is equal to R22.

Graph comparisons of the measurement data indicate that the magnitude V21 of the first measurement data 2021b is equal to the magnitude V22 of the second measurement data 2022b. In the graphs of FIGS. 11A to 11C, the x-axis represents time, and the y-axis represents, for example, a voltage or a conversion value.

Since the diameter R21 of the shadow 2021a measured by the first measurement sensor 131 is equal to the diameter R22 of the shadow 2022a measured by the second measurement sensor 133, it is determined that the second foreign substance 202 is positioned on the boundary between the first region 101 and the second region 102. Further, since graph comparisons of the first measurement data 2021b and the second measurement data 2022b indicate that V21 is equal to V22, it is determined that the second foreign substance 202 is positioned on the boundary between the first region 101 and the second region 102. Further, if the second foreign substance 202 is present in the inspection region 103, the graph changes from Vref, and thus the position of the second foreign substance 202 in the z-axis direction can be determined from $t_{detected}$.

Hereinafter, referring to FIGS. 7 and 12A to 13C, a method for fabricating a substrate according to some embodiments of the present inventive concept will be described. For clarity of explanation, a duplicate description of components described above will be omitted, and only differences between embodiments will be described.

Figure 12A:
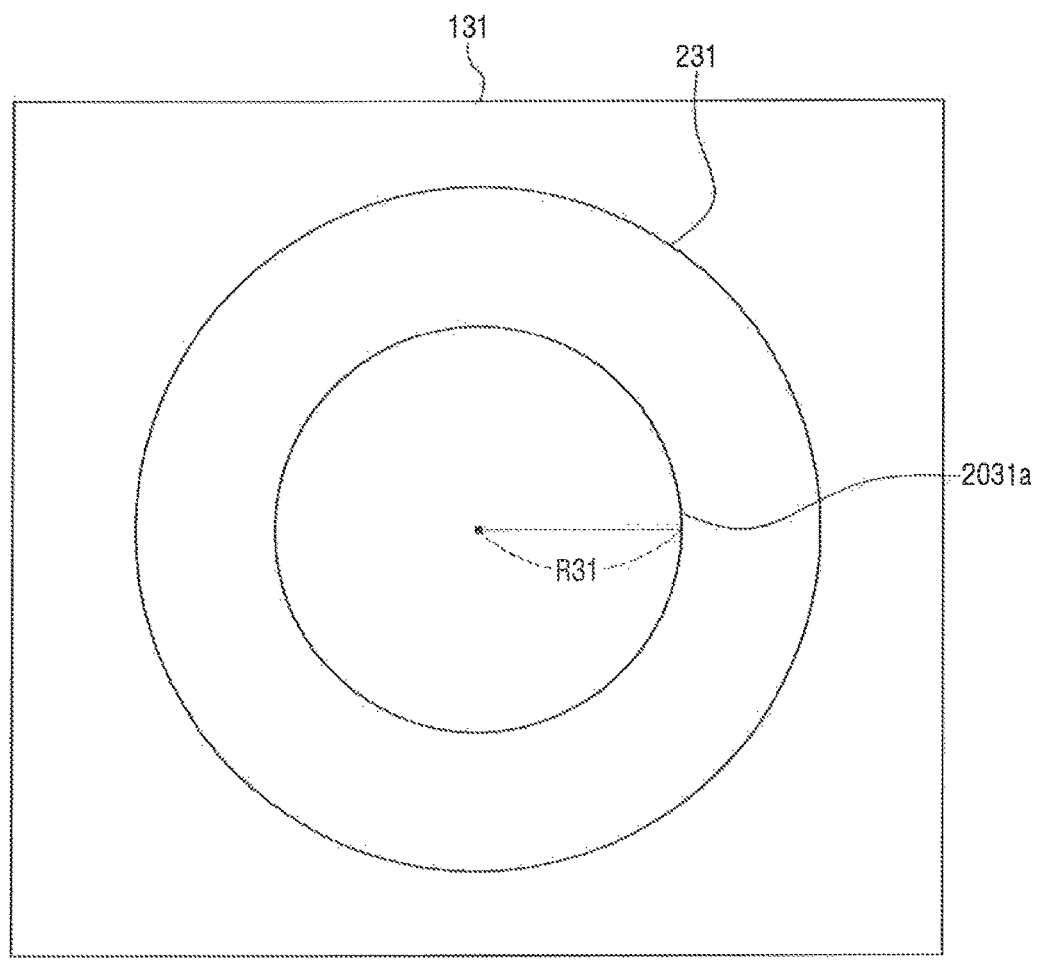
FIGS. 12A to 12C illustrate a method for fabricating a substrate according to some embodiments of the present inventive concept.
Figure 12B:
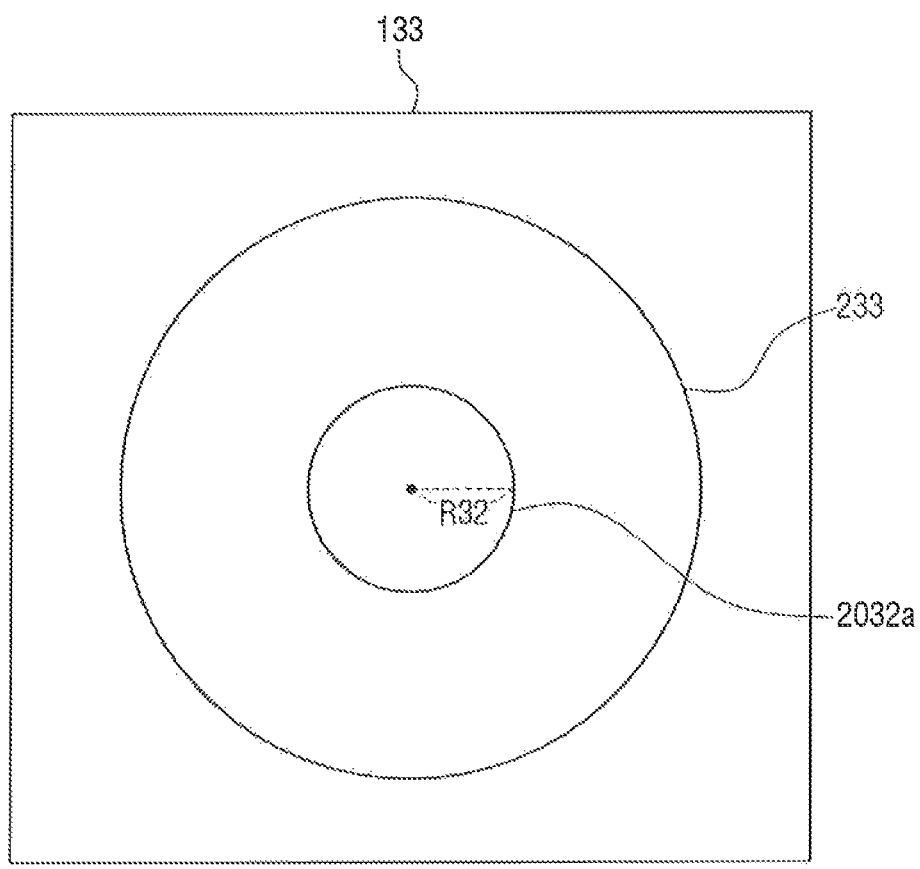
Figure 12C:
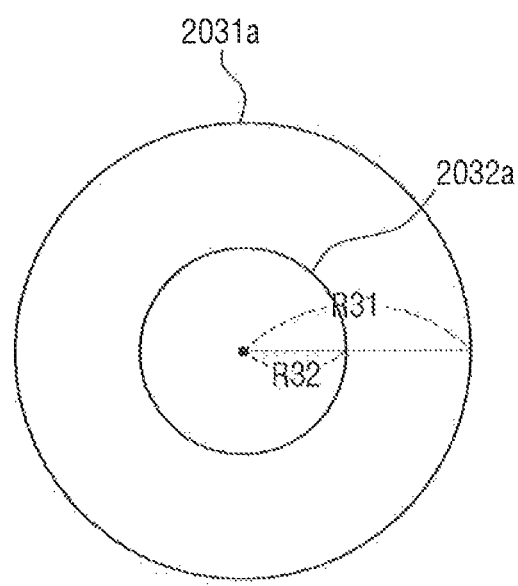
Figure 13A:
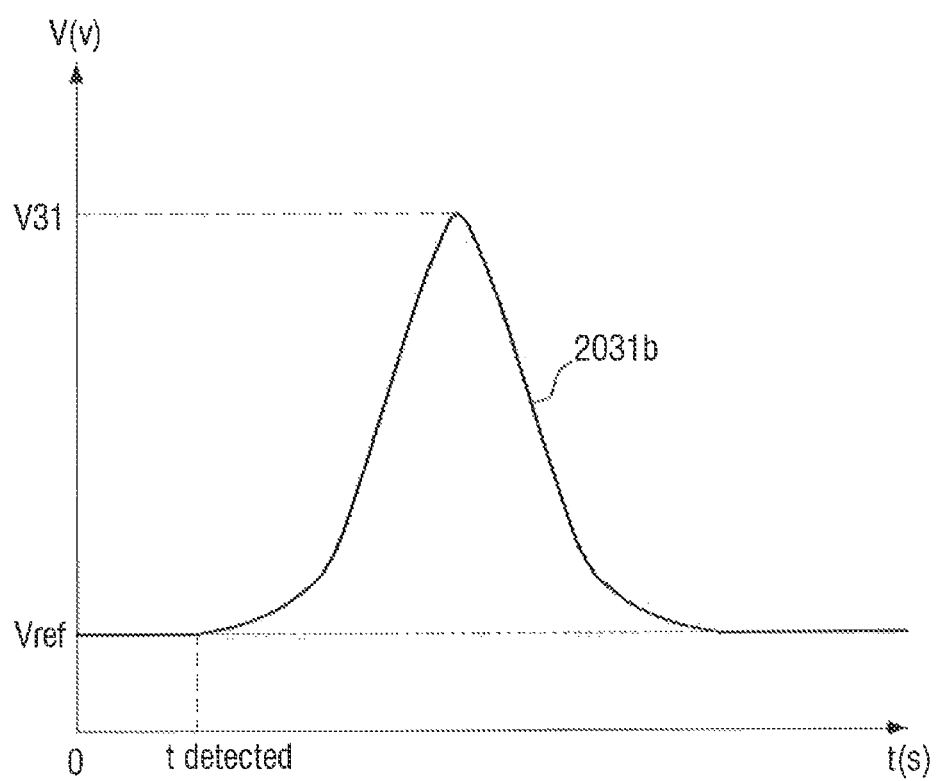
FIGS. 13A to 13C are graphs that illustrate a method for fabricating a substrate according to some embodiments of the present inventive concept.
Figure 13B:
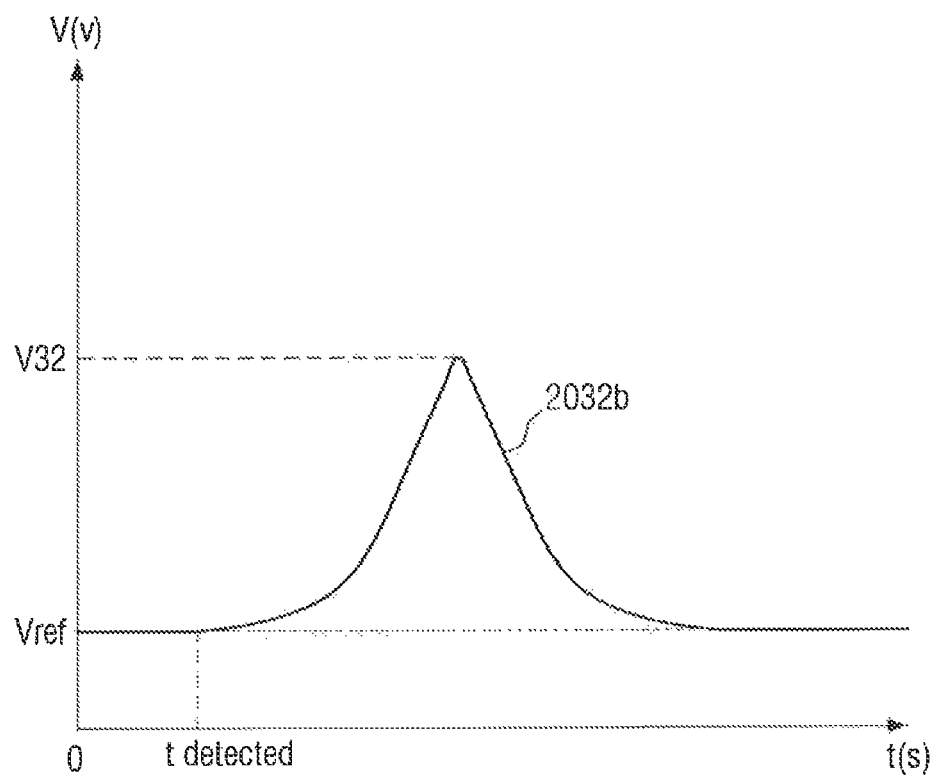
Figure 13C:
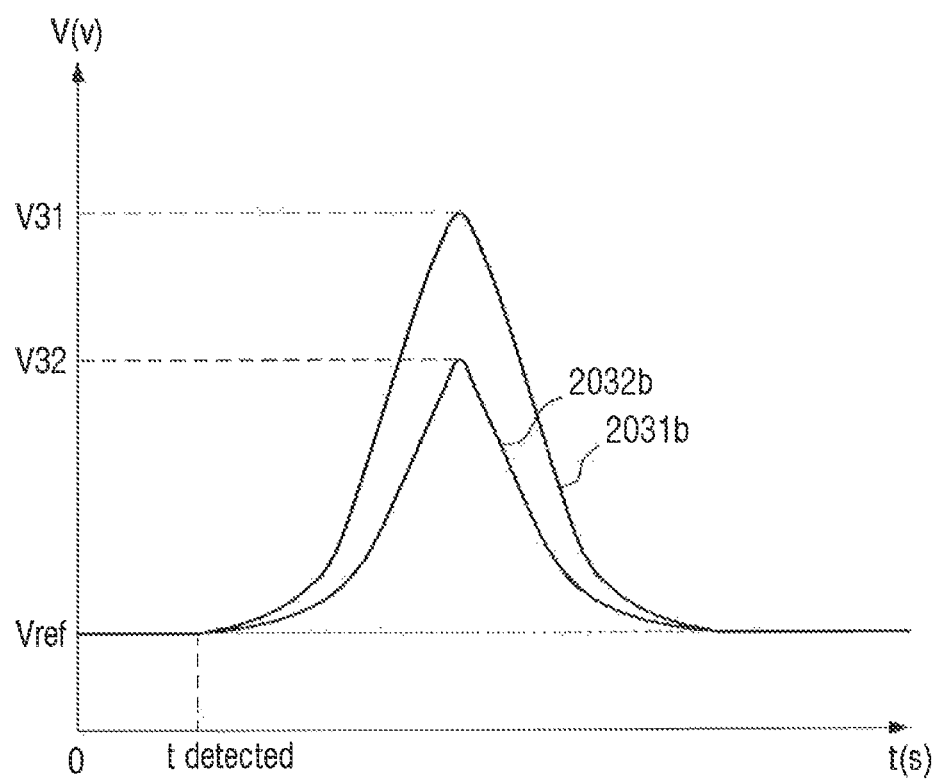

FIG. 12A illustrates an exemplary shadow 2031a measured by the first measurement sensor 131, and FIG. 13A is a graph of the first measurement data 2031b measured by the first measurement sensor 131. FIG. 12B illustrates an exemplary shadow 2032a measured by the second measurement sensor 133, and FIG. 13B is a graph of the second measurement data 2032h measured by the second measurement sensor 133. FIG. 12C illustrates a comparison of the shadow 2031a of the first measurement sensor 131 with the shadow 2032a of the second measurement sensor 133, and FIG. 13C is a graph of the comparison of the first measurement data 2031b with the second measurement data 2032b.

Referring to FIGS. 7 and 12A to 13C, a third foreign substance 203 is positioned in the second region 102.

According to some embodiments, the second region 102 is positioned closer to the second measurement sensor 133 than the first region 101. If the third foreign substance 203 is positioned in the second region 102, the diameter of the shadow 2031a measured by the first measurement sensor 131 is R31. Similarly, the diameter of the shadow 2032a measured by the second measurement sensor 133 is R32. In this case, since the third foreign substance 203 is positioned in the second region 102, R31 is greater than R32.

Graph comparisons of the measurement data indicate that the magnitude V31 of the first measurement data 2031b is greater than the magnitude V32 of the second measurement data 2032b. In the graphs of FIGS. 13A to 13C, the x-axis represents time, and the y-axis represents, for example, a voltage or a conversion value.

Since the diameter R31 of the shadow 2031a measured by a light receiving portion 231 of the first measurement sensor 131 is greater than the diameter R32 of the shadow 2032a measured by a light receiving portion 233 of the second measurement sensor 133, it is determined that the third foreign substance 203 is positioned in the second region 102 close to the second measurement sensor 133. Further, since graph comparisons of the first measurement data 2031b and the second measurement data 2032b indicate that V31 is greater than V32, it is determined that the third foreign substance 203 is positioned in the second region 102. Further, if the third foreign substance 203 is present in the first surface 100, the graph changes from Vref, and thus the position of the third foreign substance 203 in the z-axis direction can be determined from $t_{detected}$.

Hereinafter, referring to FIGS. 14 to 20C, a method for fabricating a substrate according to some embodiments of the present inventive concept will be described. For clarity of explanation, a duplicate description of components described above will be omitted, and only differences between embodiments will be described.

Figure 14:
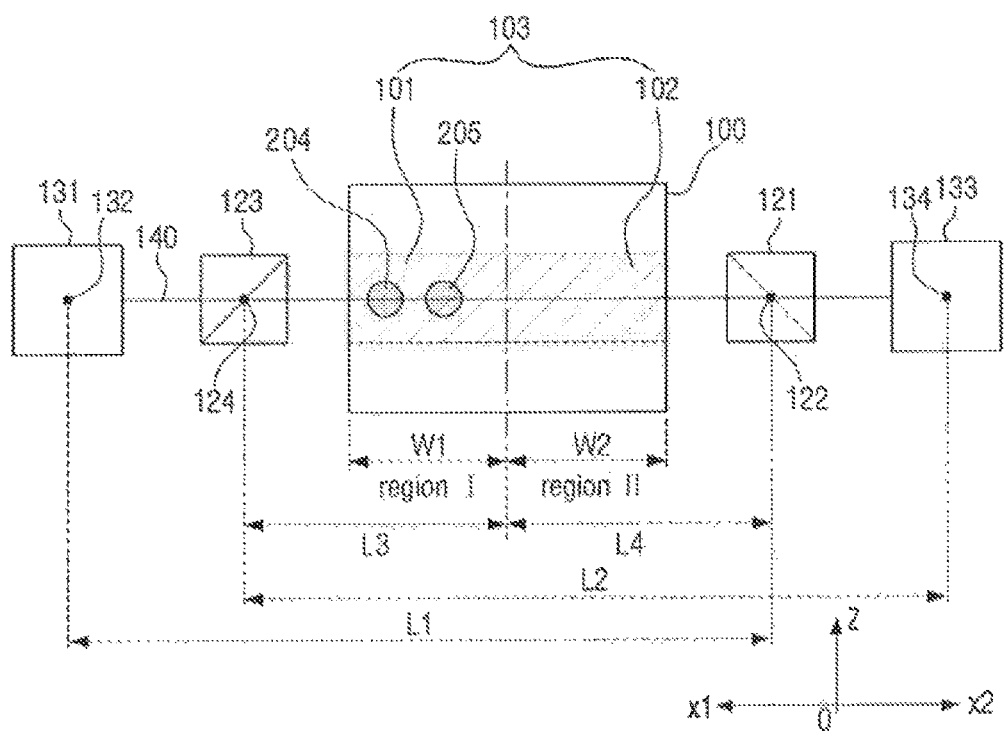
FIGS. 14 to 15C illustrate a method for fabricating a substrate according to some embodiments of the present inventive concept.

FIG. 14 is a bottom view of FIG. 2A, and illustrates a case when foreign substances 204 and 205 are present in the first surface 100. In FIG. 14, it is assumed that the sizes of the foreign substances 204 and 205 are equal to each other. Further, in FIG. 14, the arrangement of the first measurement sensor 131, the second measurement sensor 133, the first beam splitter 121, and the second beam splitter 123 is exemplary. Further, for convenience of explanation, the first light source 111 and the second light source 113 are omitted. For convenience of explanation, the shapes of the foreign substances 204 and 205 are assumed to be circular, but the shapes are not limited thereto.

Figure 15A:
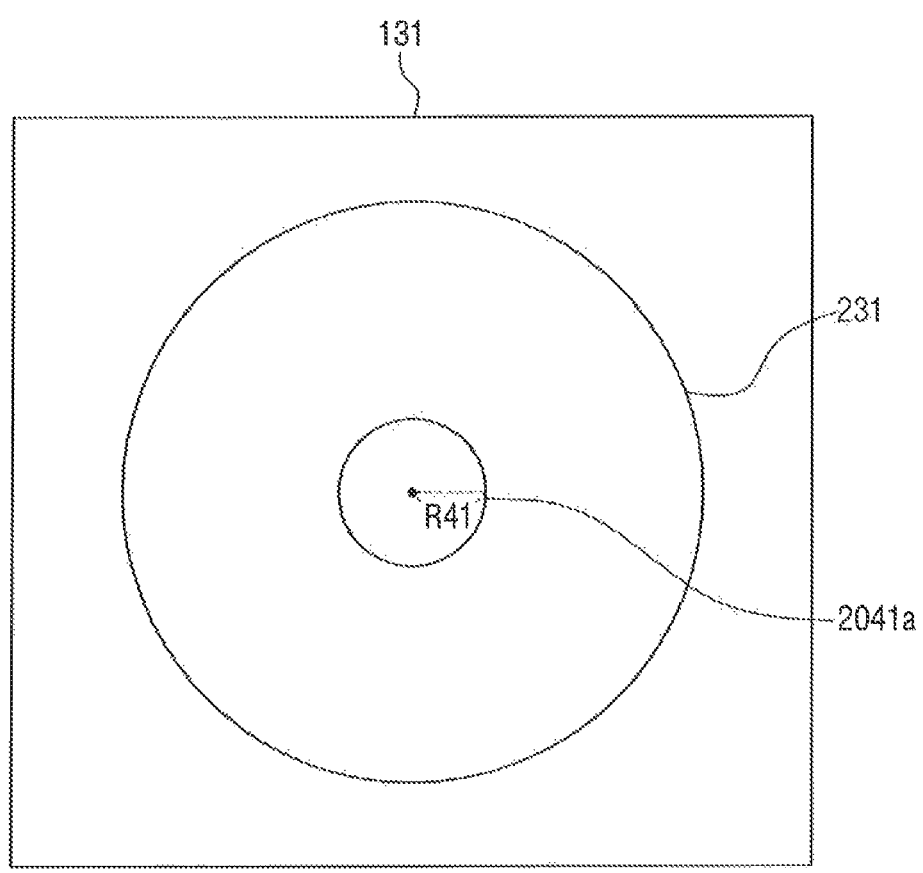
Figure 15B:
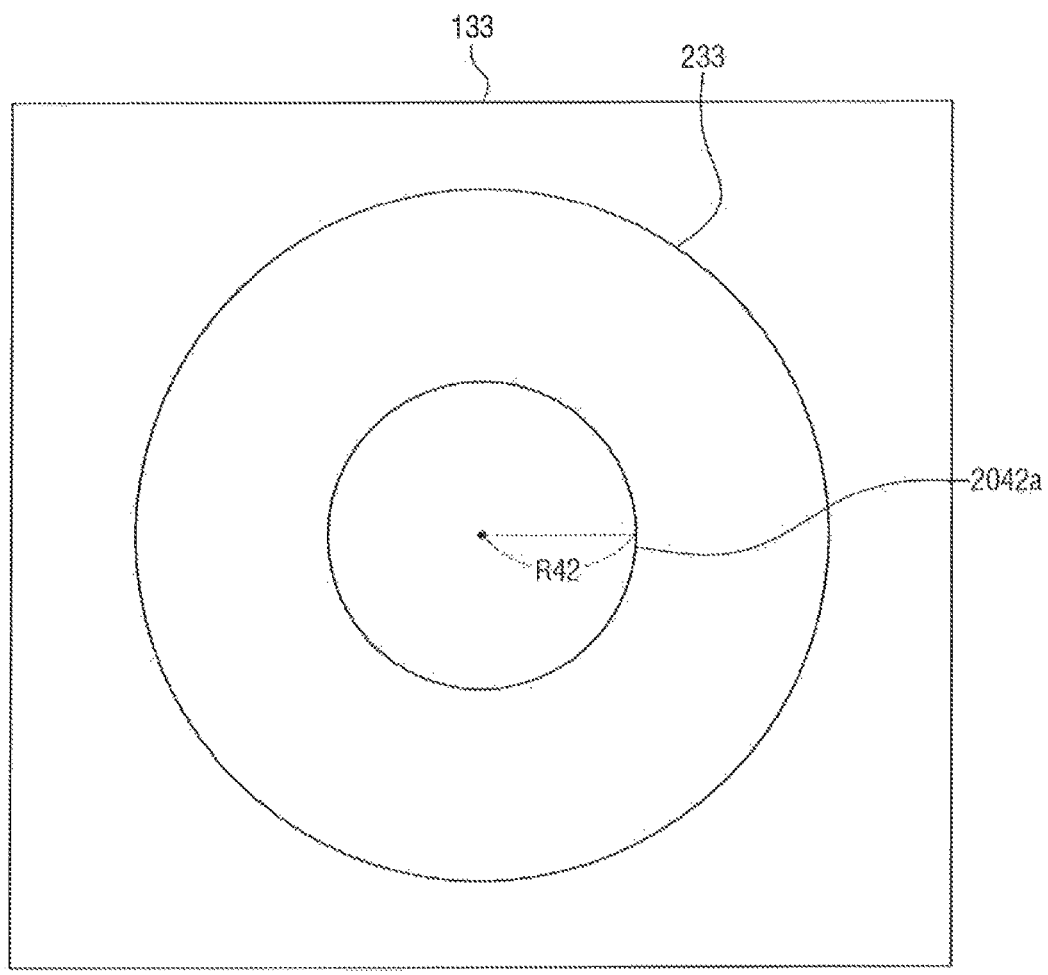
Figure 15C:
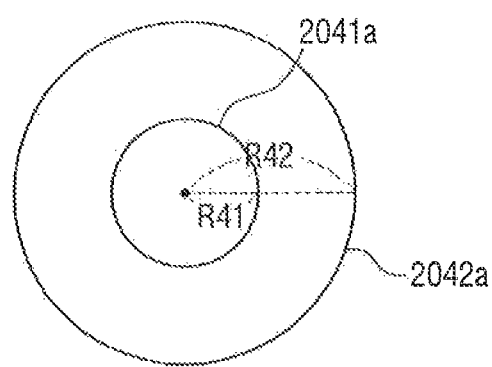
Figure 17A:
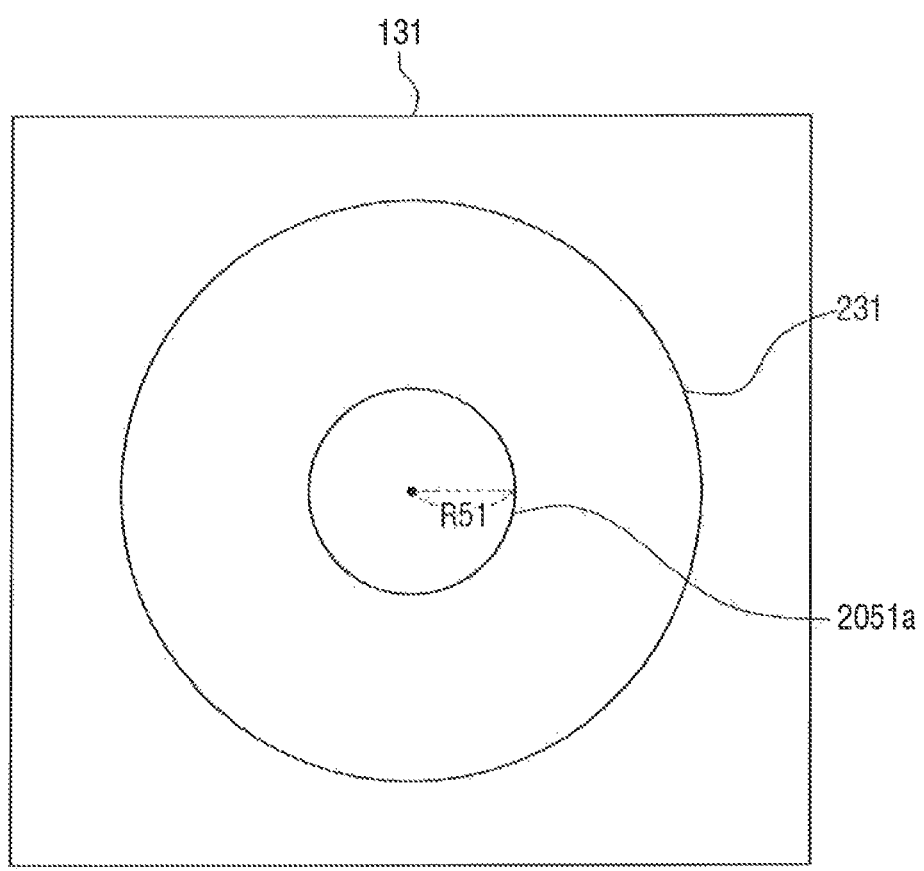
FIGS. 17A to 17C illustrate a method for fabricating a substrate according to some embodiments of the present inventive concept.
Figure 17B:
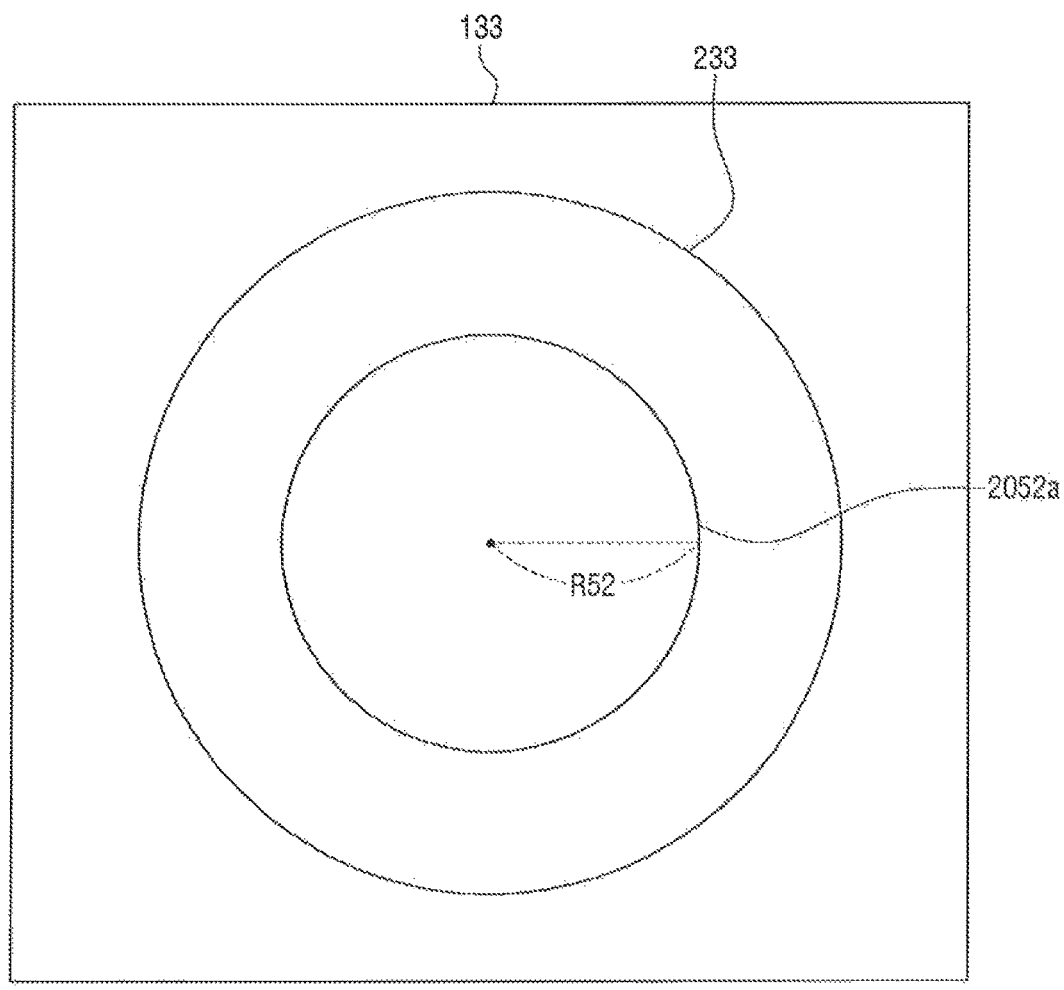
Figure 17C:
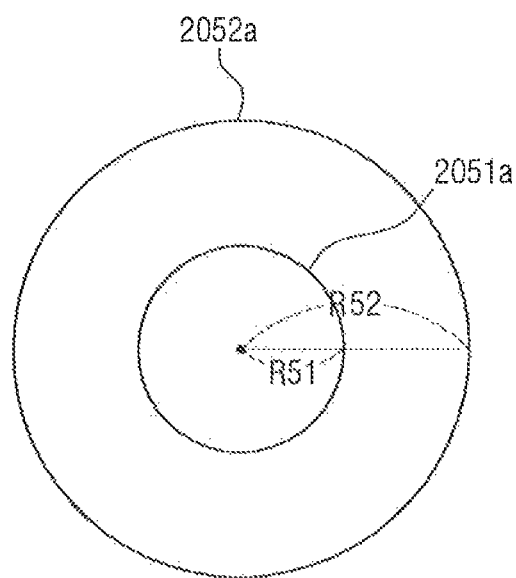

FIGS. 15A and 17A illustrate exemplary shadows 2041a and 2051a measured by the first measurement sensor 131, and FIGS. 1513 and 17B illustrate exemplary shadows 2042a and 2052a measured by the second measurement sensor 133. FIGS. 15C and 17C illustrate comparisons of the shadows 2041a and 2051a of the first measurement sensor 131 with the shadows 2042a and 2052a of the second measurement sensor 133.

Figure 16A:
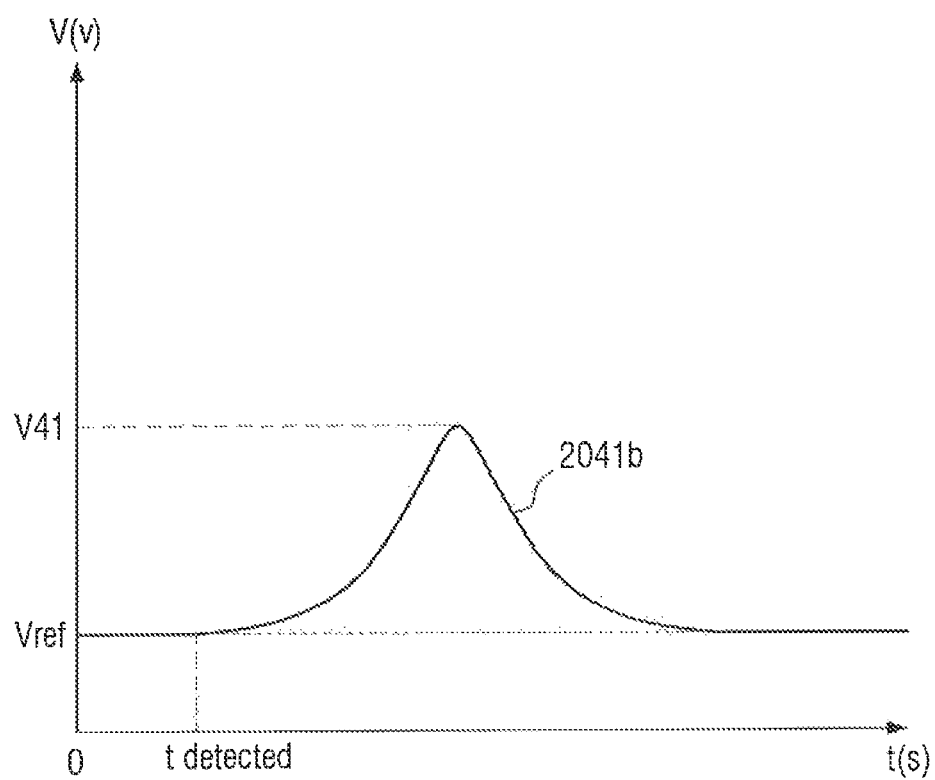
Figure 16B:
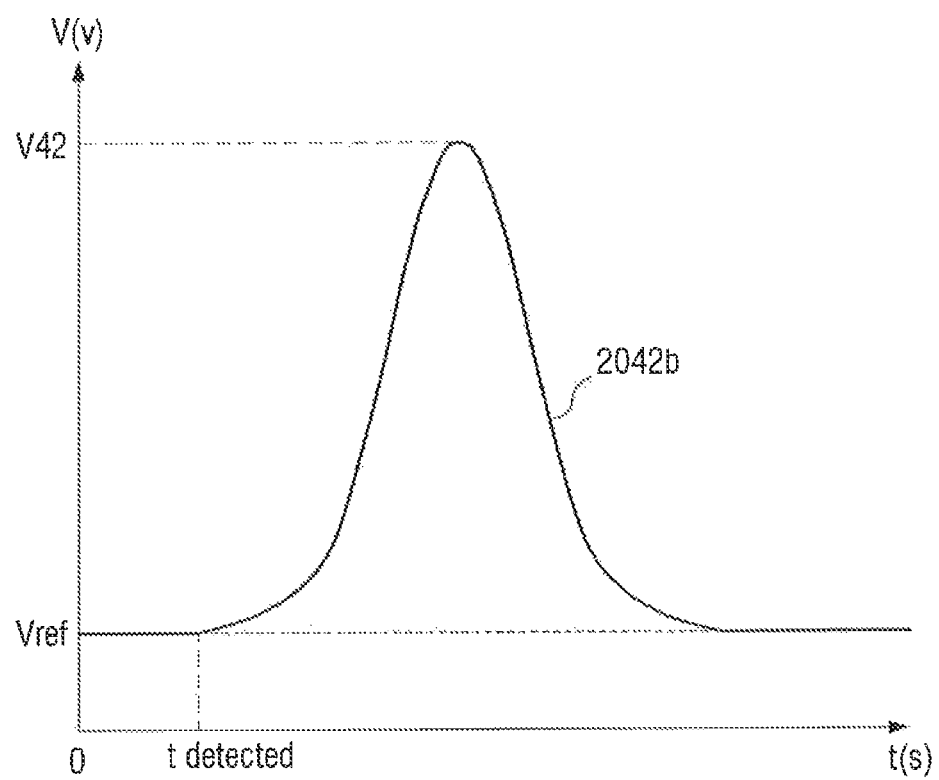
Figure 18A:
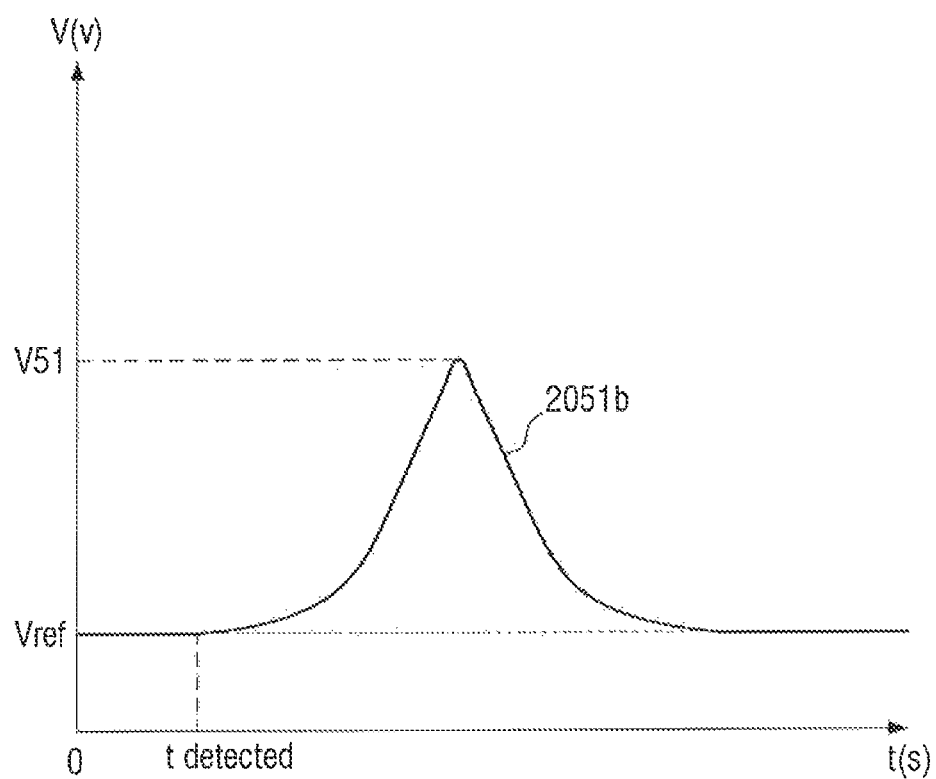
FIGS. 18A to 18C are graphs that illustrate a method for fabricating a substrate according to some embodiments of the present inventive concept.
Figure 18B:
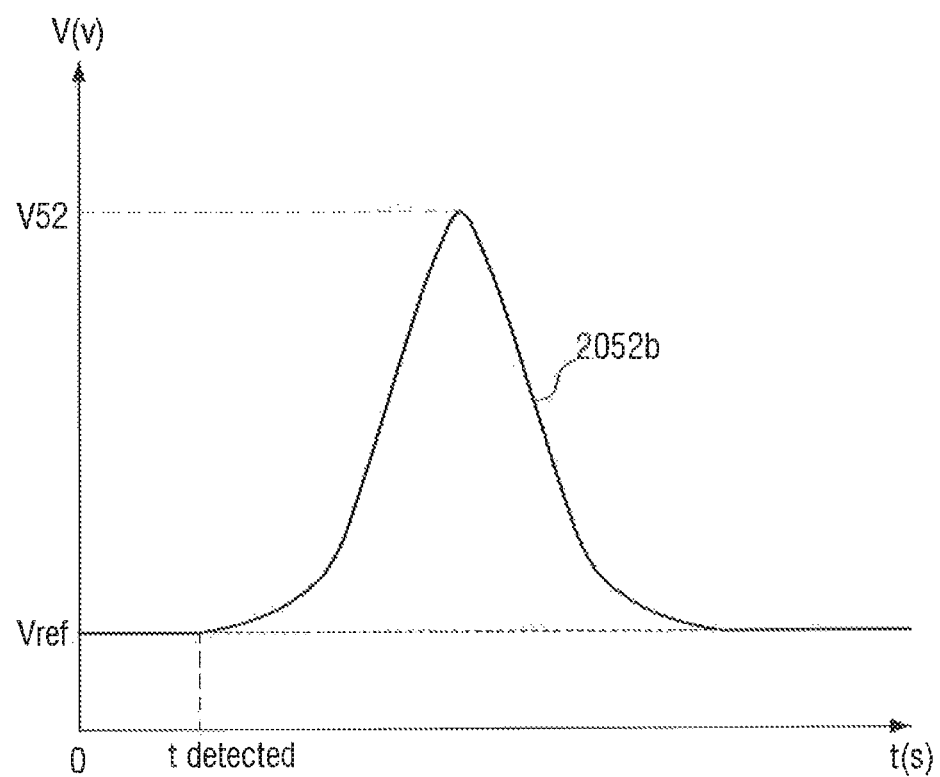
Figure 18C:
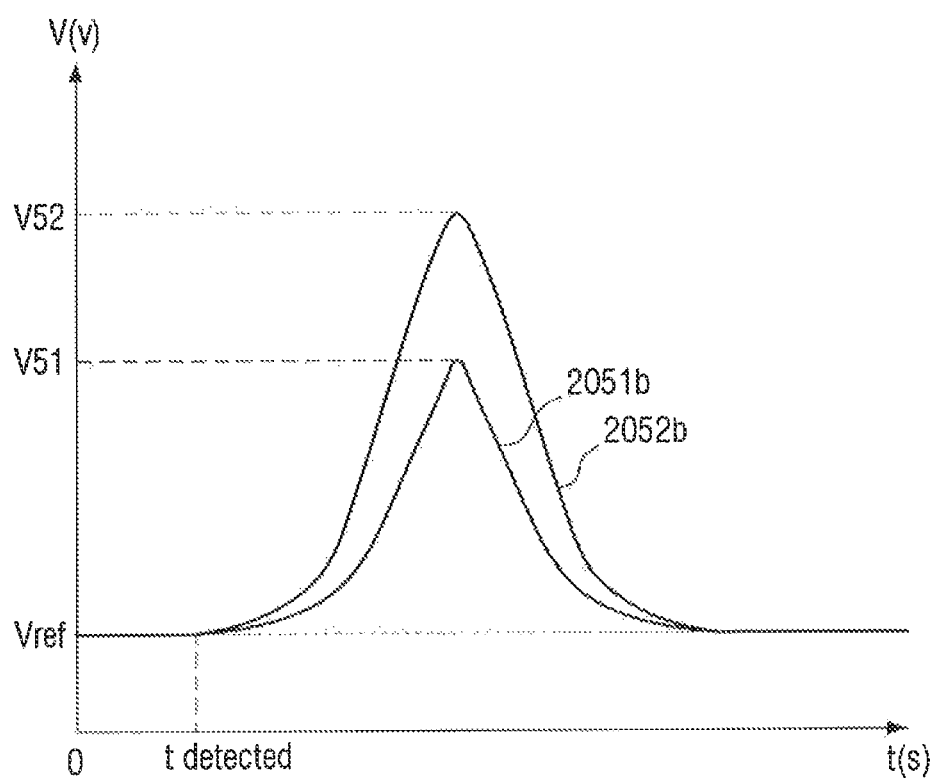

FIGS. 16A and 18A are graphs of the first measurement data 2041b and 2051b measured by the first measurement sensor 131, and FIGS. 16B and 18B are graphs of the second measurement data 2042b and 2052b measured by the second measurement sensor 133. FIGS. 16C and 18C are graphs of the comparisons of the first measurement data 2041b and 2051b with the second measurement data 2042b and 2052b.

Figure 19A:
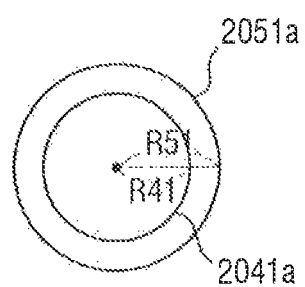
FIGS. 19A to 19B illustrate a method for fabricating a substrate according to some embodiments of the present inventive concept.
Figure 19B:
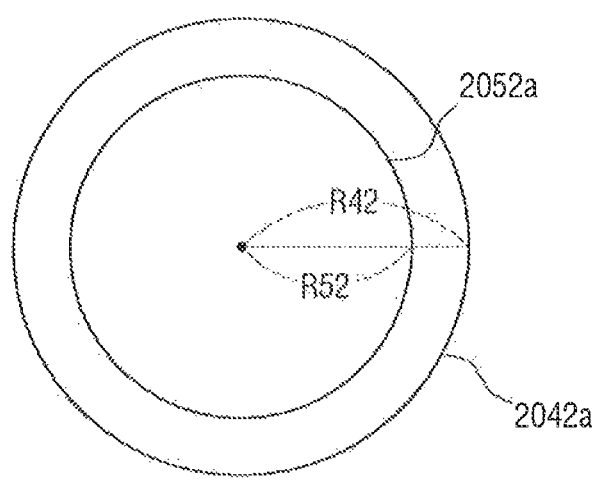

FIG. 19A illustrates the comparison of the shadows 2041a and 2051a measured by the first measurement sensor 131, and FIG. 19B illustrates the comparison of the shadows 2042a and 2052a measured by the second measurement sensor 133.

Figure 20A:
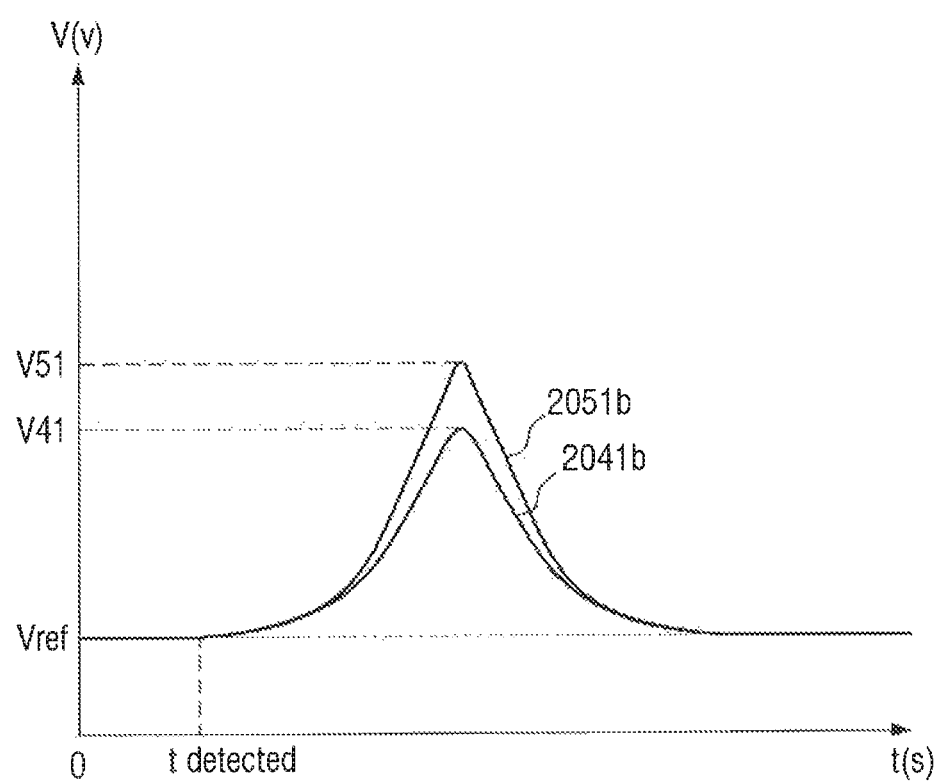
FIGS. 20A to 20C are graphs that illustrate a method for fabricating a substrate according to some embodiments of the present inventive concept.
Figure 20B:
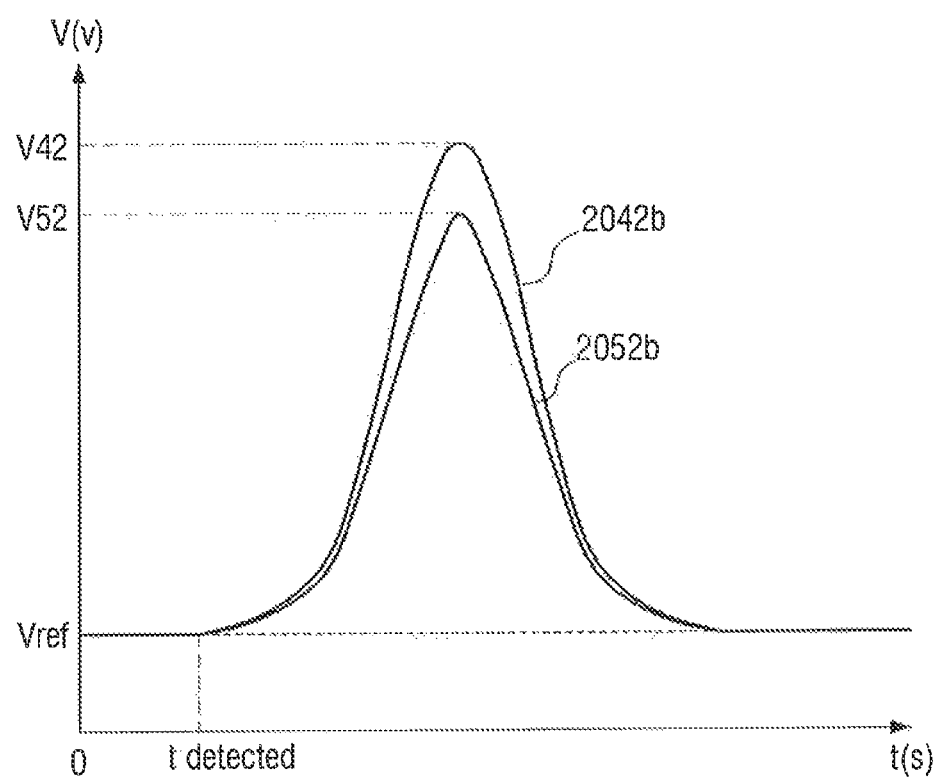
Figure 20C:
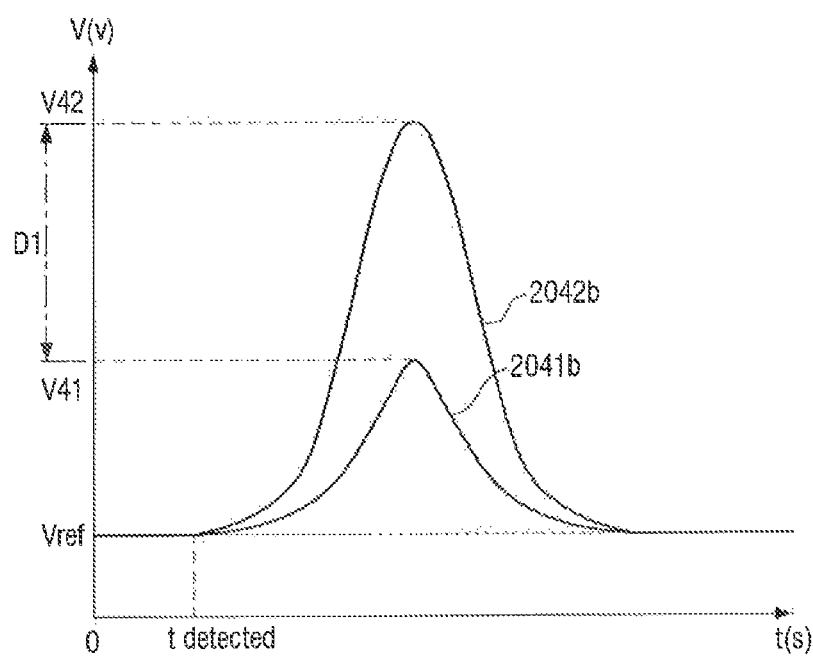
Figure 20C:
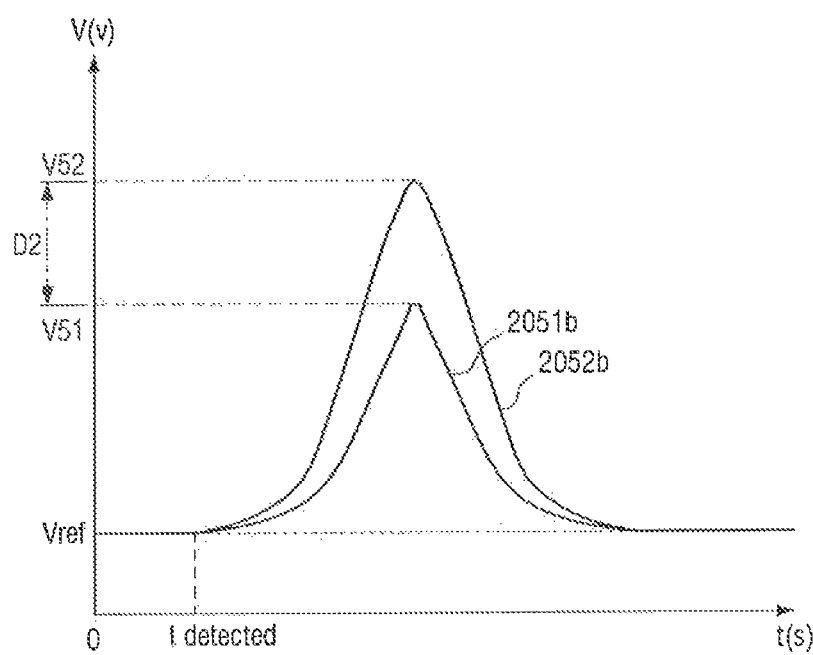

FIG. 20A is a graph of the first measurement data 2041b and 2051b measured by the first measurement sensor 131, and FIG. 20B is a graph of the second measurement data 2042b and 2052b measured by the second measurement sensor 133. FIG. 20C illustrates the comparison of the graph of FIG. 20A with the graph of FIG. 20B. In the graphs of FIGS. 16A to 16C, 17A to 17C, and 20A to 20C, the x-axis represents time, and the y-axis represents, for example, a voltage or a conversion value.

Referring to FIGS. 14 to 20C, the fourth foreign substance 204 and the fifth foreign substance 205 are positioned in the first region 101.

In the case of the fourth foreign substance 204, the diameter R41 of the shadow 2041a measured by a light receiving portion 231 of the first measurement sensor 131 is less than the diameter R42 of the shadow 2042a measured by a light receiving portion 233 of the second measurement sensor 133.

Further, the magnitude V41 of the first measurement data 2041b is less than the magnitude V42 of the second measurement data 2042b.

Similarly, in the case of the fifth foreign substance 205, the diameter R51 of the shadow 2051a measured by the light receiving portion 231 of the first measurement sensor 131 is less than the diameter R52 of the shadow 2052a measured by the light receiving portion 233 of the second measurement sensor 133.

Further, the magnitude V51 of the first measurement data 2051b is less than the magnitude V52 of the second measurement data 2052b.

Since the shadow 2041a measured by the first measurement sensor 131 and the first measurement data 2042a are respectively smaller than the shadow 2051a measured by the second measurement sensor 133 and the second measurement data 2052a, it is determined that both the fourth foreign substance 204 and the fifth foreign substance 205 are positioned in the first region 101. Further, if a foreign substance is present in the inspection region 103, the graph changes from Vref, and thus the positions of the fourth and fifth foreign substances 204 and 205 in the z-axis direction can be determined from $t_{detected}$.

On the other hand, according to a method for fabricating a semiconductor device according to embodiments of the present inventive concept, it is possible to estimate the positions of the fourth and fifth foreign substances 204 and 205 in the first region 101 using the shadows 2041a and 2051a measured by the first measurement sensor 131, the shadows 2042a and 2052b measured by the second measurement sensor 133, the first measurement data 2041b and 2051b, and the second measurement data 2042b and 2052b.

According to an embodiment, the diameter R41 of the shadow 2041a measured by the first measurement sensor 131 is less than the diameter R51 of the shadow 2051a measured by the first measurement sensor 131. Similarly, the diameter R42 of the shadow 2042a measured by the second measurement sensor 133 is greater than the diameter R52 of the shadow 2052a measured by the second measurement sensor 133.

On the other hand, the magnitude V41 of the first measurement data 2041b is less than the magnitude V51 of the first measurement data 2051b. Further, the magnitude V42 of the second measurement data 2042b is greater than the magnitude V52 of the second measurement data 2052b.

Accordingly, it is determined that the fourth foreign substance 204 is closer to the first measurement sensor 131 than the fifth foreign substance 205. That is, the fourth foreign substance 204 is positioned farther from the boundary between the first region 101 and the second region 102 than the fifth foreign substance 205.

Further, the difference D1 between the first measurement data 2041b and the second measurement data 2042b is greater than the difference D2 between the first measurement data 2051b and the second measurement data 2052b.

Accordingly, it can be determined that the fourth foreign substance 204 is positioned farther from the boundary between the first region 101 and the second region 102 than the fifth foreign substance 205.

That is, as the difference in magnitude between the first measurement data and the second measurement data becomes greater, it can be determined that the foreign substances are positioned farther from the boundary between the first region 101 and the second region 102.

According to a method for fabricating a semiconductor device according to embodiments of the present inventive concept, positions of the foreign substances present on the first surface 100 of the inspection device 10 can be determined more accurately by compensating for errors by comparing the first measurement data measured by the first measurement sensor 131 with the second measurement data measured by the second measurement sensor 133.

Further, according to a method for fabricating a semiconductor device according to embodiments of the present inventive concept, by determining positions of the foreign substances present on the first surface 100 of the inspection device 10, production of inferior products can be prevented, and thus production yield of products can be increased.

While embodiments of the present inventive concept have been particularly shown and described with reference to exemplary embodiments thereof, it will be understood by those of ordinary skill in the art that various changes in form and details may be made therein without departing from the spirit and scope of embodiments of the present inventive concept as defined by the following claims. It is therefore desired that the exemplary embodiments be considered in all respects as illustrative and not restrictive, reference being made to the appended claims rather than the foregoing description to indicate the scope of the disclosure.

What is claimed is:

1. A method for fabricating a substrate, comprising:
    forming a first substrate that includes a thin film transistor array;
    forming a second substrate by mounting a semiconductor chip that drives the thin film transistor array of the first substrate, wherein the second substrate includes a second surface; and
    inspecting a first surface of an inspecting device;
    loading the second substrate wherein the second surface faces the first surface on the inspection device; and
    inspecting the second surface of the second substrate using the inspection device,
    wherein inspecting the first surface of the inspection device includes:
        generating first measurement data by detecting a first measurement light that is parallel to a surface of an inspection region in the first surface;
        generating second measurement data by detecting a second measurement light that is parallel to the surface of the inspection region; and
        inspecting a state of the surface of the inspection region by comparing the first measurement data with the second measurement data.

2. The method of claim 1, wherein the second measurement light propagates in a direction opposite to that of the first measurement light.

3. The method of claim 1, wherein inspecting the state of the surface of the inspection region comprises determining positions of foreign substances on the inspection region.

4. The method of claim 3, wherein
    the first measurement light and the second measurement light propagate in an x-axis direction,
    the inspection region includes a first region and a second region,
    a width of the first region in the x-axis direction is equal to a width of the second region in the x-axis direction, and
    determining the positions of the foreign substances includes determining which of the first region and the second region the foreign substances are positioned in.

5. The method of claim 4, wherein determining which of the first region and the second region the foreign substances are positioned in comprises:
    determining that the foreign substances are positioned on a boundary between the first region and the second region, if a magnitude of the first measurement data is equal to a magnitude of the second measurement data;
    determining that the foreign substances are positioned in the first region, if the magnitude of the first measurement data is less than the magnitude of the second measurement data; and
    determining that the foreign substances are positioned in the second region, if the magnitude of the first measurement data is greater than the magnitude of the second measurement data.

6. The method of claim 1, wherein comparing the first measurement data with the second measurement data comprises comparing a magnitude of the first measurement data with a magnitude of the second measurement data.

7. The method of claim 1, wherein the first measurement light is emitted from a first light source, propagates through a first beam splitter and is incident to a first measurement sensor after passing the first surface,
a propagation direction of the first measurement light is changed by 90° by the first beam splitter,
the second measurement light is emitted from a second light source, propagates through a second beam splitter and is incident to a second measurement sensor after passing the first surface, and
a propagation direction of the second measurement light is changed by 90° by the second beam splitter.

8. The method of claim 7, wherein the first measurement sensor and the second measurement sensor are respectively positioned on each side of the inspection device.

9. A method for fabricating a substrate, comprising:
forming a first substrate that includes a thin film transistor array;
inspecting a first surface of an inspecting device;
forming a second substrate by mounting a semiconductor chip that drives the thin film transistor array of the first substrate, wherein the second substrate includes a second surface;
loading the second substrate wherein the second surface faces the first surface on the inspection device; and
inspecting the second surface of the second substrate using the inspection device,
wherein inspecting the first surface of the inspection device includes:
generating first measurement data by detecting a first measurement light that passes foreign substances on a surface of an inspection region in the first surface;
generating second measurement data by detecting a second measurement light that passes the foreign substances and propagates in a direction opposite to that of the first measurement light; and
determining positions of the foreign substances by comparing the first measurement data with the second measurement data.

10. The method of claim 9, wherein the first measurement light and the second measurement light propagate in an x-axis direction,
the inspection region includes a first region and a second region,
a width of the first region in the x-axis direction is equal to a width of the second region in the x-axis direction, and
determining positions of foreign substances includes determining which of the first region and the second region the foreign substances are positioned in.

11. The method of claim 10, wherein determining which of the first region and the second region the foreign substances are positioned in comprises:
determining that the foreign substances are positioned on a boundary between the first region and the second region, if a magnitude of the first measurement data is equal to a magnitude of the second measurement data;
determining that the foreign substances are positioned in the first region, if the magnitude of the first measurement data is less than the magnitude of the second measurement data; and
determining that the foreign substances are positioned in the second region if the magnitude of the first measurement data is greater than the magnitude of the second measurement data.

12. The method of claim 9, wherein comparing the first measurement data with the second measurement data comprises comparing a magnitude of the first measurement data with a magnitude of the second measurement data.

13. The method of claim 9, wherein the first measurement light is emitted from a first light source, propagates through a first beam splitter and is incident to a first measurement sensor after passing the first surface,
a propagation direction of the first measurement light is changed by 90° by the first beam splitter,
the second measurement light is emitted from a second light source, propagates through a second beam splitter and is incident to a second measurement sensor after passing the first surface, and
a propagation direction of the second measurement light is changed by 90° by the second beam splitter.

14. The method of claim 13, wherein the first measurement sensor and the second measurement sensor are respectively positioned on each side of a target of the inspection.

15. A method for fabricating a substrate, comprising:
inspecting a first surface of an inspecting device, including
generating first measurement data by detecting a first measurement light that is parallel to a surface of an inspection region in the first surface, wherein the inspection region includes a first region and a second region;
generating second measurement data by detecting a second measurement light that is parallel to the surface of the inspection region; and
determining which of the first region and the second region the foreign substances are positioned in by comparing a magnitude of the first measurement data with a magnitude of the second measurement data,
wherein determining which of the first region and the second region the foreign substances are positioned in comprises:
determining that the foreign substances are positioned on a boundary between the first region and the second region, if the magnitude of the first measurement data is equal to the magnitude of the second measurement data;
determining that the foreign substances are positioned in the first region, if the magnitude of the first measurement data is less than the magnitude of the second measurement data; and
determining that the foreign substances are positioned in the second region, if the magnitude of the first measurement data is greater than the magnitude of the second measurement data.

16. The method of claim 15, further comprising:
forming a first substrate that includes a thin film transistor array;
forming a second substrate by mounting a semiconductor chip that drives the thin film transistor array of the first substrate, wherein the second substrate includes a second surface;
loading the second substrate wherein the second surface faces the first surface on the inspection device; and
inspecting the second surface of the second substrate using the inspection device.

17. The method of claim 15, wherein
the first measurement light is emitted from a first light source, propagates through a first beam splitter and is incident to a first measurement sensor after passing the first surface,
a propagation direction of the first measurement light is changed by 90° by the first beam splitter,
the second measurement light is emitted from a second light source, propagates through a second beam splitter and is incident to a second measurement sensor after passing the first surface,
a propagation direction of the second measurement light is changed by 90° by the second beam splitter, and
the second measurement light propagates in a direction opposite to that of the first measurement light.

* * * * *